(12) United States Patent
Elsherbini et al.

(10) Patent No.: US 11,842,826 B2
(45) Date of Patent: Dec. 12, 2023

(54) ADDITIVE MANUFACTURING FOR INTEGRATED CIRCUIT ASSEMBLY CONNECTOR SUPPORT STRUCTURES

(71) Applicant: Intel Corporation, Santa Clara, CA (US)

(72) Inventors: Adel Elsherbini, Tempe, AZ (US); Feras Eid, Chandler, AZ (US); Johanna Swan, Scottsdale, AZ (US); Georgios Dogiamis, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 581 days.

(21) Appl. No.: 16/909,264

(22) Filed: Jun. 23, 2020

(65) Prior Publication Data

US 2021/0398715 A1 Dec. 23, 2021

(51) Int. Cl.
| | |
|---|---|
| *H01L 21/786* | (2006.01) |
| *H01B 13/22* | (2006.01) |
| *H01B 13/00* | (2006.01) |
| *H01B 7/00* | (2006.01) |
| *H01B 7/18* | (2006.01) |
| *H01L 21/768* | (2006.01) |
| *B33Y 10/00* | (2015.01) |
| *B33Y 80/00* | (2015.01) |

(52) U.S. Cl.
CPC ....... *H01B 13/0036* (2013.01); *H01B 7/0018* (2013.01); *H01B 7/1805* (2013.01); *H01B 13/002* (2013.01); *H01B 13/0026* (2013.01); *H01B 13/22* (2013.01); *H01L 21/76885* (2013.01); *B33Y 10/00* (2014.12); *B33Y 80/00* (2014.12)

(58) Field of Classification Search
CPC .......................... H01B 13/0036; H01L 21/768
See application file for complete search history.

(56) References Cited

U.S. PATENT DOCUMENTS

| | | |
|---|---|---|
| 3,066,063 A | 11/1962 | Ecklund et al. |
| 3,405,228 A | 10/1968 | Polizzano |
| 3,459,877 A | 8/1969 | Bullock et al. |
| 3,553,811 A | 1/1971 | Garner |
| 3,562,899 A | 2/1971 | Stout et al. |
| 3,648,201 A | 3/1972 | Gissel |
| 3,720,994 A | 3/1973 | Wagele |
| 3,754,697 A | 8/1973 | Stout et al. |
| 3,758,353 A | 9/1973 | Huriez |
| 3,813,272 A | 5/1978 | Straughan |
| 5,515,603 A | 5/1996 | Ziemek et al. |
| 5,857,255 A | 1/1999 | Wichmann |

(Continued)

*Primary Examiner* — Dale E Page
*Assistant Examiner* — Wilner Jean Baptiste
(74) *Attorney, Agent, or Firm* — Essential Patents Group, LLP

(57) ABSTRACT

Cables, cable connectors, and support structures for cantilever package and/or cable attachment may be fabricated using additive processes, such as a coldspray technique, for integrated circuit assemblies. In one embodiment, cable connectors may be additively fabricated directly on an electronic substrate. In another embodiment, seam lines of cables and/or between cables and cable connectors may be additively fused. In a further embodiment, integrated circuit assembly attachment and/or cable attachment support structures may be additively formed on an integrated circuit assembly.

20 Claims, 14 Drawing Sheets

(56) References Cited

U.S. PATENT DOCUMENTS

| | | | |
|---|---|---|---|
| 6,007,347 | A | 12/1999 | Keldsen et al. |
| 6,326,551 | B1 | 12/2001 | Adams |
| 6,695,062 | B2 | 2/2004 | Dalrymple |
| 7,646,093 | B2 * | 1/2010 | Braunisch ............ H05K 1/0204 |
| | | | 438/117 |
| 7,683,744 | B2 | 3/2010 | Mahlandt et al. |
| 8,640,740 | B2 | 2/2014 | Herbst |
| 10,173,286 | B2 | 1/2019 | Dowd et al. |
| 10,845,552 | B2 * | 11/2020 | Liff ...................... G02B 6/0005 |
| 11,598,928 | B2 | 3/2023 | Dowd et al. |
| 2004/0029406 | A1 | 2/2004 | Loveless |
| 2004/0151448 | A1 | 8/2004 | Adams et al. |
| 2017/0194744 | A1 | 7/2017 | Guetig et al. |
| 2018/0166183 | A1 | 6/2018 | Fernandez |
| 2019/0387653 | A1 | 12/2019 | Kimoto et al. |
| 2021/0037191 | A1 | 2/2021 | Lee et al. |

\* cited by examiner

ADDITIVE MANUFACTURING FOR INTEGRATED CIRCUIT ASSEMBLY CONNECTOR SUPPORT STRUCTURES

TECHNICAL FIELD

Embodiments of the present description generally relate to the field of integrated circuit assembly or structure fabrication, and, more specifically, to an integrated circuit assembly or structure including at least one component fabricated with an additive process.

BACKGROUND

The world is experiencing ever more interconnection between integrated circuit devices, which in turn results in significant increases the consumption of data. With these increases, the demands on computer servers to supply this data increases. These demands include, but are not limited to, increased date rates, advanced switching architectures that require longer interconnects, advanced power solutions, and the like.

As will be understood to those skilled in the art, there may be a variety of signal and power interconnects within servers and high-performance computing architectures to operate individual components and/or to electrically connect components therein. These interconnects may include interconnects on multi-chip packages (MCPs), within-blade interconnects (e.g. socket-to-socket), within rack interconnects (e.g. blade to blade), and rack-to-rack or rack-to-switch interconnects. Currently, short interconnects (for example, within rack interconnects and some rack-to-rack interconnects) are achieved with electrical cables. Theses electrical cable may include ethernet cables, co-axial cables, twin-axial cables, and the like, depending on the required data rate. For longer distances, optical solutions are generally employed due to the very long reach and high bandwidth enabled by fiber optic solutions. However, as new architectures emerge, such as 100 Gigabit ethernet, traditional electrical connections are becoming increasingly expensive and power demanding to support the required data rates. For example, to extend the reach of a cable or the given bandwidth on a cable, higher quality cables may need to be used or advanced equalization, modulation, and/or data correction techniques employed, which add power and latency to the system. For some distances and data rates required in proposed architectures, there are currently no viable electrical solutions. Although optical solutions, such as optical transmission over fiber, may be capable of supporting the required data rates and distances, there is a severe power and cost penalty, especially for short to medium distances (e.g. a few meters).

Furthermore, components, such as integrated circuit packages, require very large number of system connections. These connections are needed for power delivery since thermal design power of integrated circuit packages can reach 100s-1000s of watts, which requires a very large number of power pins. Additionally, large number of high-speed input/output (HSIO) connections, such as 16+ channel double data rate (DDR) and 128+ peripheral component interconnect express (PCIE) lanes, are needed to support the demand for higher bandwidth to system memory and other accelerators. This leads to very complex and high cost large sockets to support the huge number of pins between the integrated circuit package and the electronic substrate to which it is connected. Furthermore, the power and high-speed input/output signals need to travel through a relatively resistive and high parasitic path through a relatively large number of material layers from one side of the integrated circuit package to the other and through socket pins. This may result in poor power efficiency and reduced high speed channel link budget. Thus, at least one cable, in addition to the socket, may be utilized to provide at least a portion of the power and high-speed input/output signals.

Therefore, there is a need for cost effective and reliable cables, cable connectors, and attachment structures that can support very high data rates.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
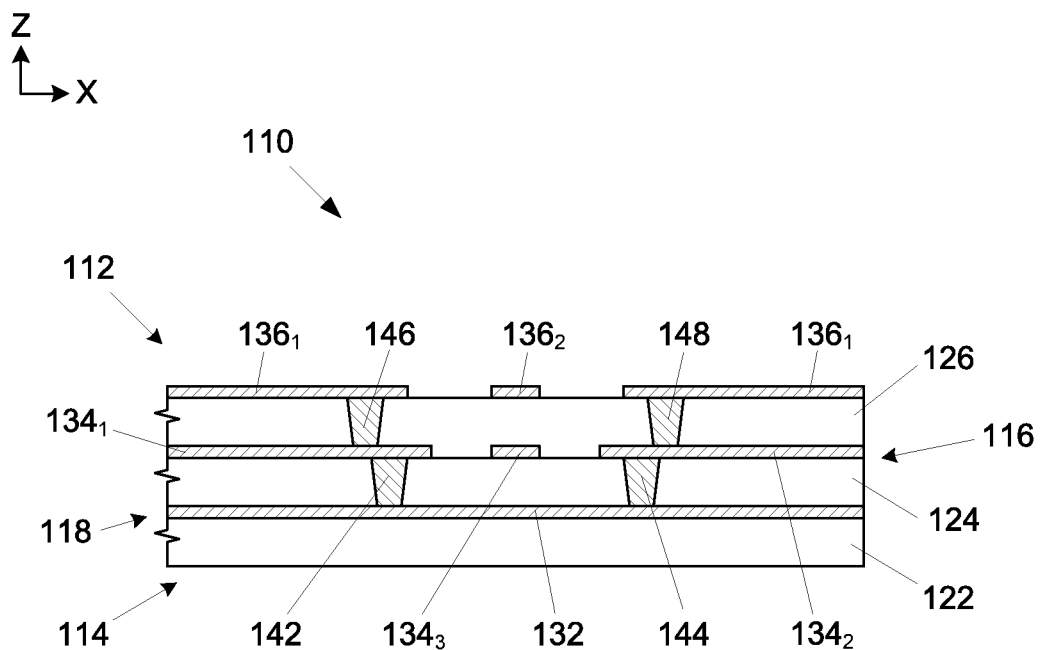
FIG. 1 is a side cross-sectional view of an electronic substrate, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the formation of cables, cable connectors, and support structures for cantilever package and/or cable attachment connects using additive processes, such as a coldspray technique, for integrated circuit assemblies. In one embodiment, cable connectors may be additively fabricated directly on an electronic substrate. In another embodiment, seam lines of cables and/or between cables and cable connectors may be additively fused. In a further embodiment, integrated circuit assembly attachment and/or cable attachment support structures may be additively formed on an integrated circuit assembly.

The embodiments of the present description utilize additive processes, such as high throughput additive manufacturing ("HTAM"). One such HTAM process is a "coldspray" process. As the coldspray process is known in the art, it will not be illustrated, but rather merely discussed herein. With a coldspray process, solid powders of a desired material or materials to be deposited are accelerated in a carrier jet (e.g. compressed air or nitrogen) by passing the jet through a converging diverging nozzle. The jet exits the nozzle at a high velocity and reaches the underlying substrate or target, where the impact causes the solid particles in the jet to plastically deform and bond or "fuse" to the substrate. Subsequent layers of the material similarly adhere to each underlying layer upon continued jet impact, producing fast buildup (e.g. layers that are a few hundred microns thick can be deposited over an area of about 100-1000 mm$^2$ in a few seconds). Moreover, unlike thermal spraying techniques, this approach does not require melting the particles, thus protecting both the powders and the substrate from experiencing excessive processing temperatures. Because additive manufacturing, such as coldspray, is used, it eliminates the need for using lithography and the many steps associated with it (resist deposition, exposure, resist development, and resist removal) that are characteristic of subtractive or semi-additive methods, such as plating, sputtering, and the like. Additionally, 3D topography can be easily created, if needed, as will be understood to those skilled in the art. Moreover, different materials can be combined in the feed powder and used to create hybrid features in one step. The term "additively fused" for the purposes of the present description is defined to mean the fusing a first material to a second material by impacting the first material with the second material to form a bond therebetween.

In one embodiment of the present description, an additive process, such as a coldspray process, may be used to form cable connectors, such as millimeter wave (mmWave) connectors, directly on electronic substrates. FIG. 1 illustrates an electronic substrate 110, which may be any appropriate structure, including, but not limited to, an interposer, a motherboard, and the like. The electronic substrate 110 may have a first surface 112, an opposing second surface 114, and at least one side 116 extending between the first surface 112 and the second surface 114. The electronic substrate 110 may comprise a plurality of dielectric material layers (illustrated as a first dielectric material layer 122, a second dielectric material layer 124, and a third dielectric material layer 126), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, low temperature co-fired ceramic materials, and the like, as well as low-k and ultra low-k dielectrics (dielectric constants less than about 3.6), including, but not limited to, carbon doped dielectrics, fluorine doped dielectrics, porous dielectrics, organic polymeric dielectrics, fluoropolymers, and the like.

The electronic substrate 110 may further include conductive routes or "metallization" 118 extending through the electronic substrate 110. As will be understood to those skilled in the art, the conductive routes 118 may be a combination of conductive traces (shown as a first level trace 132, second level traces $134_1$, $134_2$, and $134_3$, and third level traces $136_1$ and $136_2$) and conductive vias (shown as vias 142, 144, 146, and 148) extending through the plurality of dielectric material layers. The fabrication of conductive traces and conductive vias are well known in the art and are not described for purposes of clarity and conciseness. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 110 may be a cored substrate or a coreless substrate.

Figure 2:
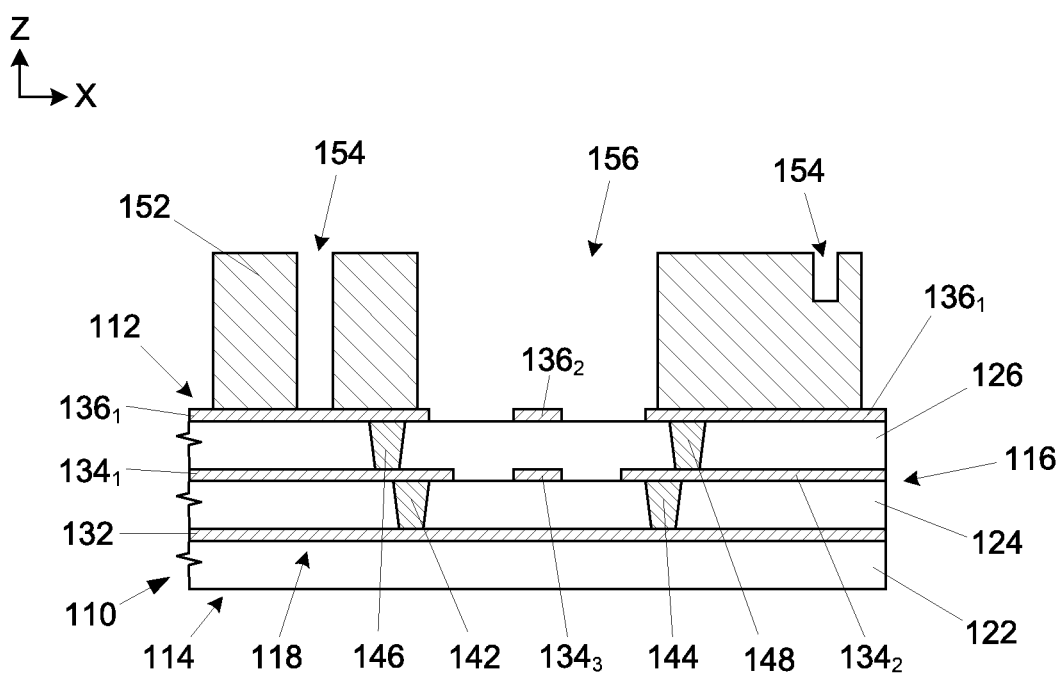
FIG. 2 is a side cross-sectional view of a cable connector formed on the electronic substrate of FIG. 1, according to an embodiment of the present description.
Figure 3:
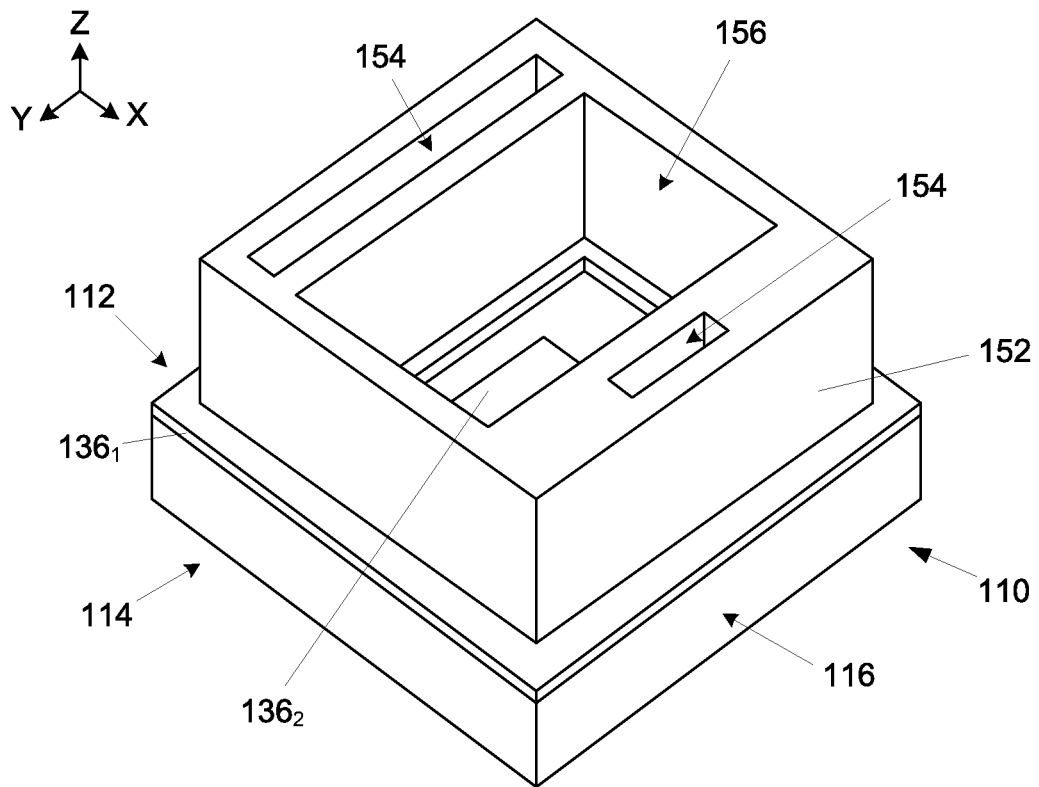
FIG. 3 is an isometric view of the cable connector of FIG. 2, according to an embodiment of the present description.

As shown in FIG. 2, the third level trace $136_1$ may be connected to ground (as well as the first level trace 132 and the second level traces $134_1$ and $134_2$), and the third level trace $136_2$ may be connected to a signal line. As shown in FIGS. 2 and 3, a cable connector 150 may be fused directly to the third level trace $136_1$, such as by an additive process. As shown, the cable connector 150 may include an alignment housing 152, comprising a conductive material (such as a metal), and at least one keying feature 154 formed in the alignment housing 152 and a cable mating opening 156, wherein the third level trace $136_2$ is exposed within the cable mating opening 156. As will be understood to those skilled in the art, the alignment housing 152 and at least one keying feature 154 orient a cable (not shown) in a z-direction and to mate it in the appropriate position within the cable mating opening 156.

It is understood that for mmWave application the third level trace 136₂ may be connect to ground and the second level traces 134₃ may be connected to a signal line may be formed along with the second level traces 134₁ and 134₂ directly below the third level trace 136₂, such that it wireless couples with the third level trace 136₂, as will be understood to those skilled in the art. For purposes of the present description, the term "signal trace" includes traces directly connected to a signal line, as well as grounded traces wirelessly coupled to a trace connected to a signal line.

Figure 4:
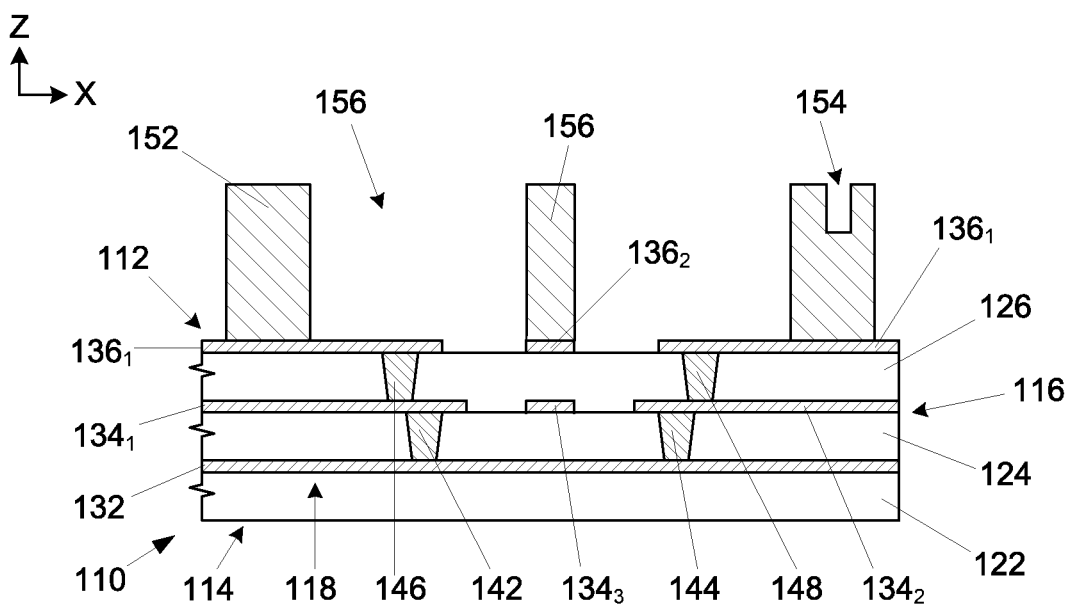
FIG. 4 is a side cross-sectional view of a cable connector formed on the electronic substrate of FIG. 1, according to another embodiment of the present description.

In another embodiment of the present description, as shown in FIG. 4, the additive process can be fabricate a connector pin 158 on the third level trace 136₂ (i.e. signal line) to receive a socket (not shown) in a cable (not shown), as will be understood to those skilled in the art. Forming the connector pin 158 directly on a signal line trace (e.g. the third level trace 136₂) of the electronic substrate 110 may ensure very reliable and low resistance electrical contact therebetween.

Figure 5:
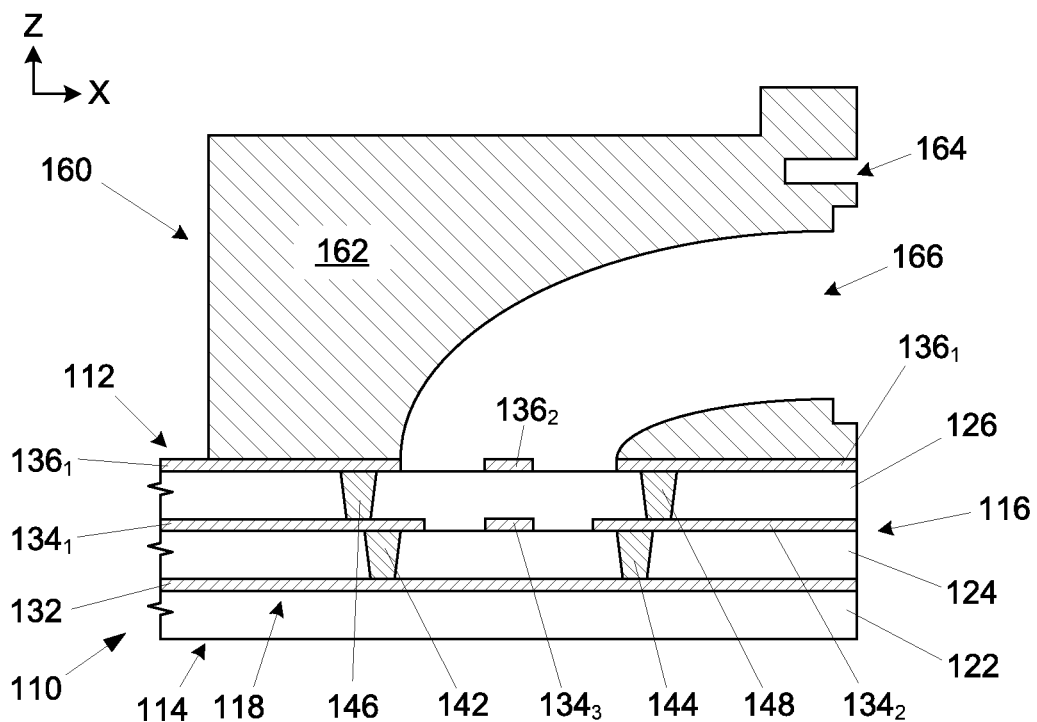
FIG. 5 is a side cross-sectional view of a side cable connector formed on the electronic substrate of FIG. 1, according to one embodiment of the present description.

In a further embodiment of the present description, as shown in FIG. 5, a side cable connector 160 may be fabricated directly on the third level trace 136₁ proximate the side 116 of the electronic substrate 110. The side cable connector 160 may include an alignment housing 162, at least one keying feature 164 formed in the alignment housing 162 and a cable mating opening 166. As will be understood to those skilled in the art, the alignment housing 162 and at least one keying feature 164 orient a cable (not shown) in a x-direction and to mate it in the appropriate position within the cable mating opening 166. In one embodiment, as shown in FIG. 5, the alignment housing 162 may be a single conductive material.

Figure 6:
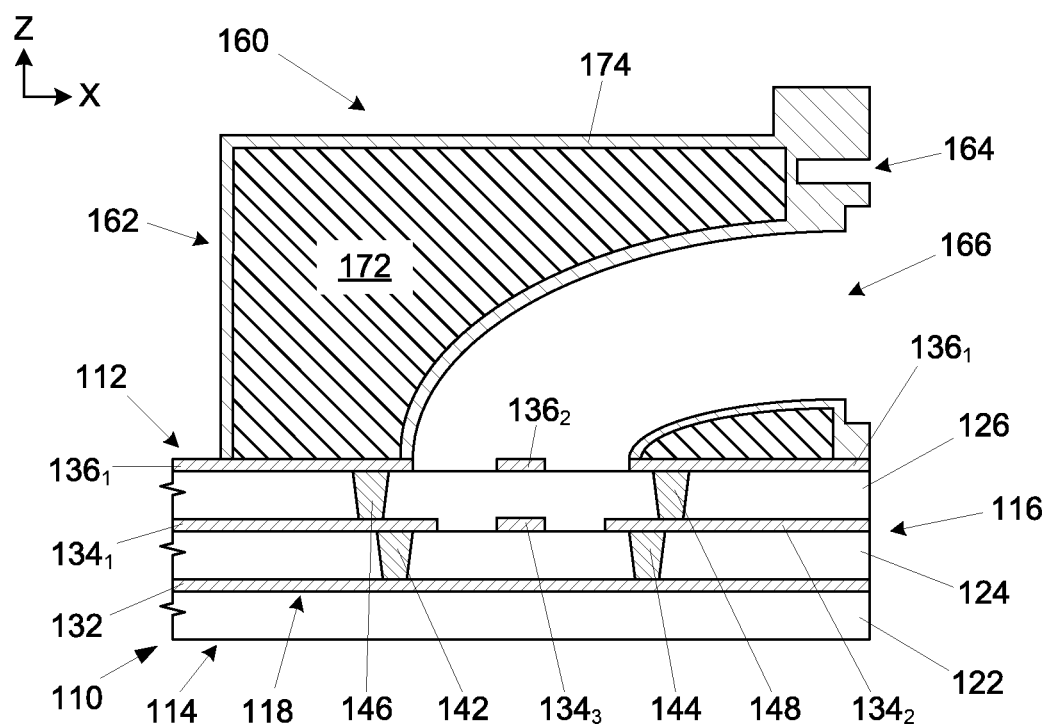
FIG. 6 is a side cross-sectional view of a side cable connector formed on the electronic substrate of FIG. 1, according to another embodiment of the present description.

Although the cable connector 150 of FIGS. 2-4 and the side cable connector 160 of FIG. 5 need to be conductive in order to be connected to ground, such that a shielding layer of a cable (not shown) can be grounded, as will be subsequently described, they need not be entirely conductive. Due to the skin effect, the cable connectors 150, 160 need only to be conductive for a few micrometers (about 1-10 um) for frequencies of operation within the mm-Wave range (i.e. larger than 30 GHz) and for typical metallic material conductivity ranges (such as copper, aluminum, silver, and the like). Thus, in another embodiment of the present description, as shown in FIG. 6, the alignment housing 162 may be fabricated with a non-conductive core 172 coated with a conductive material coating 174. It is understood that the additive process can be used to fabricate both the non-conductive core 172 and the conductive material coating 174. In one embodiment of the present description, the non-conductive core 172 may comprise a plastic material. In another embodiment of the present description, the conductive material coating 174 may comprise a metal, such as copper, silver, nickel, gold, and aluminum, alloys thereof, and the like.

Currently, cable connectors are fabricated by costly computer numerical control (CNC) milling of metal blanks. Furthermore, the ground continuity between the cable connector and the electronic substrate is achieved by mechanical contact. Using the embodiments of the present description, the cable connectors 150, 160 are built up, such as by coldspray, directly on the electronic substrate 110, so that ground continuity will be achieved by electrical contact, which may be superior from both performance and electromagnetic interference reduction perspectives compared to mechanical contact.

It is understood that sacrificial materials may be used to fabricate the cable connectors 150, 160 along with any keying features (building up on or around the sacrificial material). The sacrificial materials to be used can be either rigid materials, such as a plastic (e.g. polyether ether ketone, liquid-crystal polymer, or the like) or materials that can be reactively removed, such as with heat or chemicals, after the fabrication of the cable connectors 150, 160. Furthermore, it is understood that the cable mating openings 156, 166 can be subsequently filled with dielectric materials, if needed. In other words, they do not need to be "filled with air" as shown in FIG. 2-6.

Figure 7:
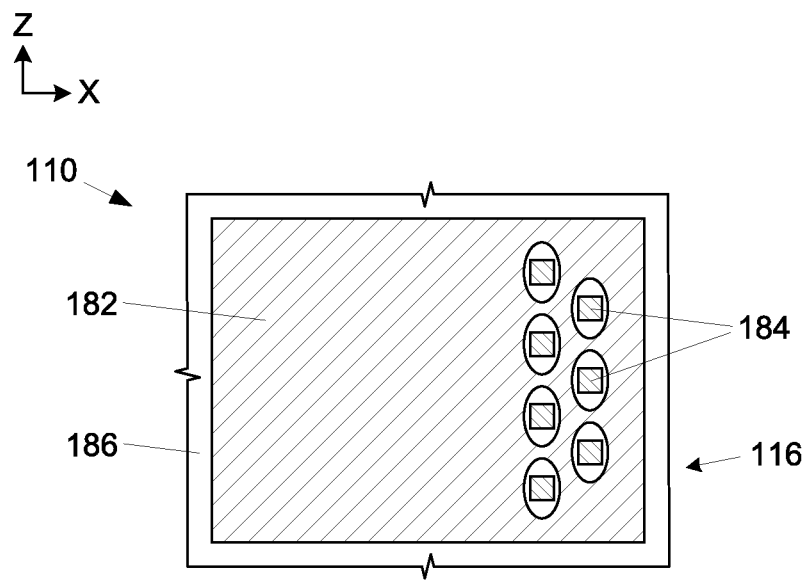
FIGS. 7-10 are plan views of process of forming a side cable connector, according to one embodiment of the present description.
Figure 8:
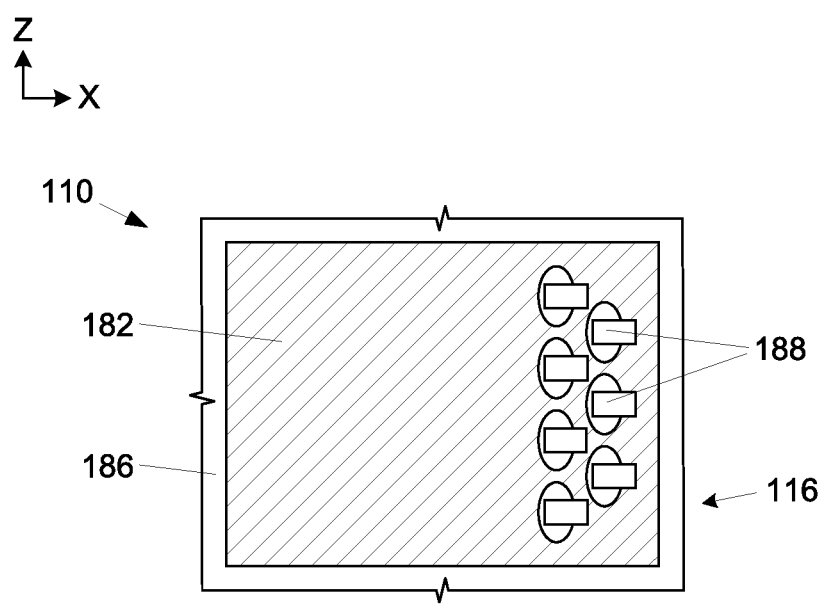

FIGS. 7-10 illustrate top plan views of a method of the fabrication of a side cable connector 180, according to one embodiment of the present description. As shown in FIG. 7, the electronic substrate 110 may be formed having a ground trace 182 (such as the third level trace 136₂ of FIGS. 1-6) and a plurality of signal traces 184 (such as the third level trace 136₁ of FIGS. 1-6) on a dielectric material layer 186 (such as the third dielectric material layer 126 of FIGS. 1-6) proximate the edge 116 of the electronic substrate 110. As shown in FIG. 8, a connector pin 188 (such as the connector pin 158 of FIG. 4) may be formed on each of the signal traces 184. In one embodiment, the connector pins 188 may be elevated in a y-direction perpendicular to the figure and do not necessary electrically contact the ground trace 182. In another embodiment, the signal traces 184 may be connect to ground (such as electrically connected to ground trace 182) and an internal signal traces (not shown) may be formed directly below the signal traces 184, such that they wireless couple with the signal traces 184, as will be understood to those skilled in the art.

Figure 9:
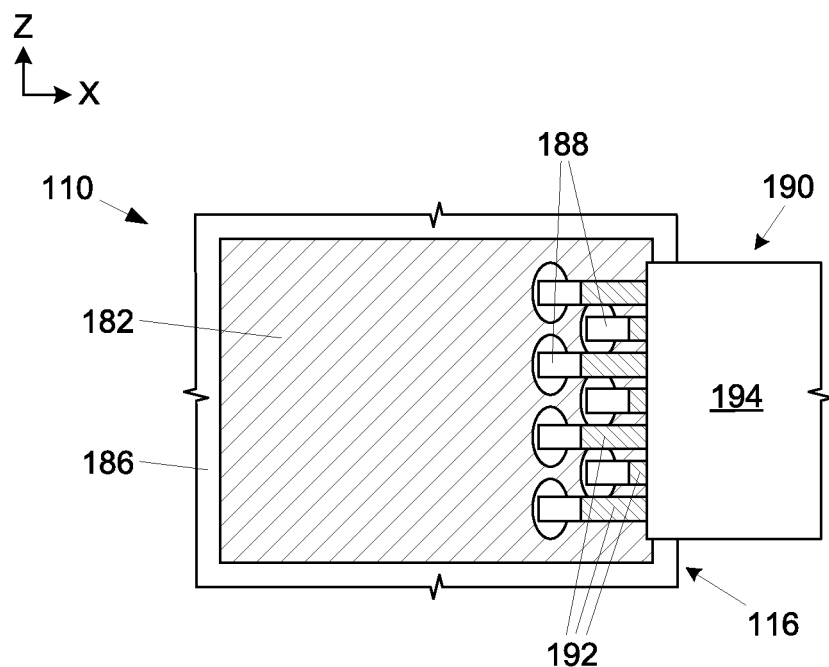
Figure 10:
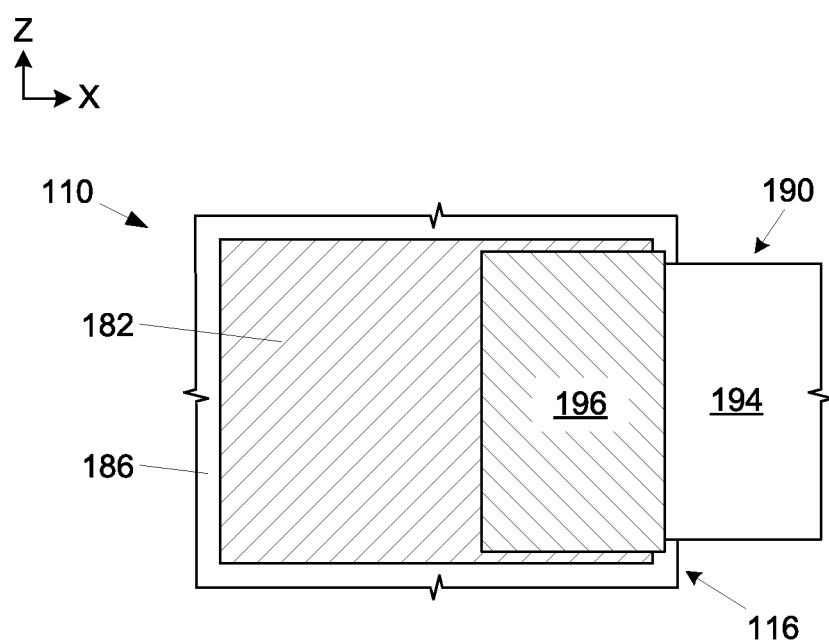

As shown in FIG. 9, a cable 190 comprising a plurality of wires 192 wrapped by, but isolated from, a shielding layer 194, may be position such that each wire 192 contacts an associated connector pin 188. As shown in FIG. 10, a cable connector 196 may be formed on the ground trace 182 and be in electrical contact therewith, wherein the cable connector 196 extends over the cable 190, such that the shielding layer 194 electrically contacts the cable connector 196. This method of fabrication may have advantages including, but not limited to, improved reliability and low ohmic contact between electrically connected components, as well as improved mechanical rigidity and strain relief points.

It is understood that although a single cable 190 is illustrated, multiple lanes/cables/waveguides may be configured and connected. It is further understood that although a "cable connection" is shown, the embodiments of the present invention can be translated for a socket or parts of a socket.

Figure 11:
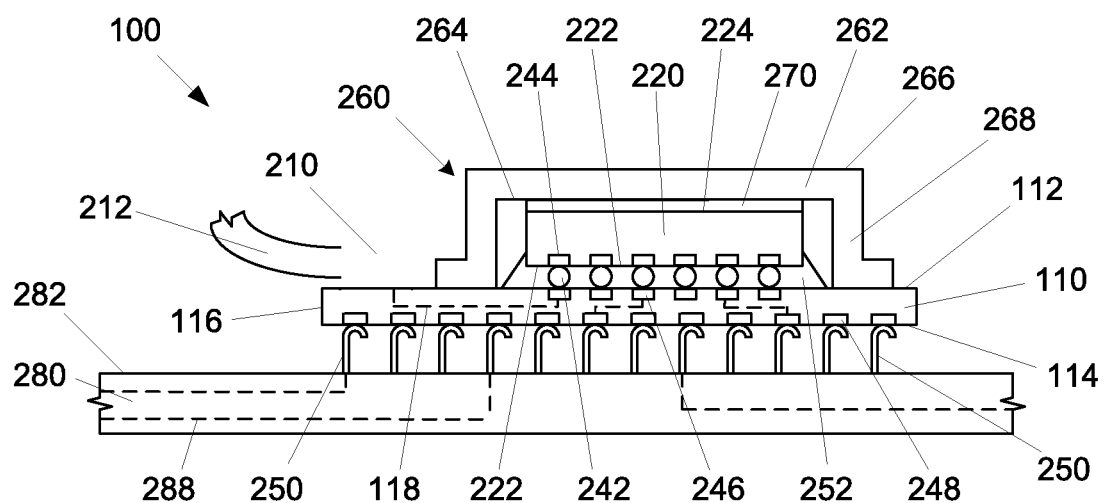
FIG. 11 is a side cross-sectional view of an integrated circuit package having a cable connector, according to another embodiment of the present description.

The embodiments of the present description, as shown in FIGS. 1-10, may be incorporated into an integrated circuit assembly. FIG. 11 illustrates an integrated circuit assembly 100 having at least one integrated circuit device 220 electrically attached to the electronic substrate 110 (such as shown in FIGS. 1-10) in a configuration generally known as a flip-chip or controlled collapse chip connection ("C4") configuration, according to an embodiment of the present description. A connector 210, such as the cable connector 150 of FIGS. 2-4 or the side cable connector 160 of FIG. 5-6, may be electrically attached to the electronic substrate 110, as previously discussed, and a cable 212 electrically attached thereto.

The integrated circuit device 220 may be any appropriate device, including, but not limited to, a microprocessor, a chipset, a graphics device, a wireless device, a memory device, an application specific integrated circuit, a transceiver device, an input/output device, combinations thereof, stacks thereof, and the like. As shown in FIG. 11, the at least one integrated circuit device 220 have a first surface 222 and an opposing second surface 224. The at least one integrated circuit device 220 may be electrically attached to the electronic substrate 110 with a plurality of device-to-substrate interconnects 242 extending between bond pads 246 on the first surface 112 of the electronic substrate 110 and bond pads 244 on the first surface 222 of the integrated circuit device 220. The device-to-substrate interconnects 242 may be any appropriate electrically conductive material or structure, including, but not limited to, solder balls, metal bumps or pillars, metal filled epoxies, or a combination thereof. In one embodiment, the device-to-substrate interconnects 242 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 242 may be copper bumps or pillars. In a further embodiment, the device-to-substrate interconnects 242 may be metal bumps or pillars coated with a solder material.

The bond pads 244 on the first surface 222 of the integrated circuit device 220 may be in electrical communication with integrated circuitry (not shown) within the integrated circuit device 220. The bond pads 246 on the first surface 112 of the electronic substrate 110 may be in electrical contact with the conductive routes 118 (shown in dashed lines) extending through the electronic substrate 110. As previously discussed, the conductive routes 118 may be a combination of conductive traces (see FIG. 1) and conductive vias (see FIG. 1) extending through the plurality of dielectric material layers (see FIG. 1).

As further shown in FIG. 1, an electrically-insulating underfill material 252 may be disposed between the integrated circuit device 220 and the electronic substrate 110, which substantially encapsulates the device-to-substrate interconnects 242. The underfill material 252 may be used to reduce mechanical stress issues that can arise from thermal expansion mismatch between the electronic substrate 110 and the integrated circuit device 220. The underfill material 252 may be an epoxy material, including, but not limited to epoxy, cyanoester, silicone, siloxane and phenolic based resins, that has sufficiently low viscosity to be wicked between the integrated circuit device 220 and the electronic substrate 110 by capillary action when introduced by an underfill material dispenser (not shown), which will be understood to those skilled in the art. The underfill material 252 may be subsequently cured (hardened), such as by heat or radiation.

The second surface 224 of the integrated circuit device 220 may be in thermal contact with a heat dissipation device 260 through a thermal interface material 270. In one embodiment of the present description, the heat dissipation device 260 may comprise a main body 262, having a thermal contact surface 264 and an opposing surface 266, and at least one boundary wall and foot 268 extending from the thermal contact surface 264 of the main body 262 of the heat dissipation device 260. The at least one boundary wall and foot 268 may be attached or sealed to the first surface 112 of the electronic substrate 110 with an attachment adhesive or sealant layer (not shown). The heat dissipation device 260 may be made of any appropriate thermally conductive material, including, but not limited to, at least one metal material and alloys of more than one metal, or highly doped glass or highly conductive ceramic material, such as aluminum nitride. In a specific embodiment of the present description, the heat dissipation device 260 may comprise copper, nickel, aluminum, alloys thereof, laminated metals including coated materials (such as nickel coated copper), and the like.

The heat dissipation device 260 may have additional thermal management devices (not shown) attached thereto (such as to the surface 266) for enhanced heat removal. Such additional thermal management devices (not shown) may include, but are not limited to, heat pipes, high surface area dissipation structures with a fan (such as a structure having fins or pillars/columns formed in a thermally conductive structure), liquid cooling devices, and the like, as will be understood to those skilled in the art.

In various embodiments of the present description, the thermal interface material 270 may be any appropriate, thermally conductive material, including, but not limited to, a thermal grease, a thermal gap pad, a polymer, an epoxy filled with high thermal conductivity fillers, such as metal particles or silicon particles, and the like.

As shown in FIG. 11, the conductive routes 118 may extend through the electronic substrate 110 and be attached to bond pads 248 on the second surface 114 of the electronic substrate 110. As will be understood to those skilled in the art, the electronic substrate 110 may reroute a fine pitch (center-to-center distance between the bond pads) of the bond pads 242 on the first surface 112 of the electronic substrate 110 to a relatively wider pitch of the bond pads 248 on the second surface 114 of the electronic substrate 110. The electronic substrate 110 may be electrically attached to an electronic board 280 through a plurality of substrate-to-substrate interconnects 250 extending between the bond pads 248 on the second surface 114 of the electronic substrate 110 and a plurality of bond pads 284 on a first surface 282 of the electronic board 280. The substrate-to-substrate interconnects 250 may be any appropriate electrically conductive component. In one embodiment, as shown, the substrate-to-substrate interconnects 250 may be resilient socket pins. It is noted that sockets are well known in the art, and for the sake of conciseness and clarity, will not be illustrated or discussed herein.

The electronic board 280 may be any appropriate structure, including, but not limited to, a motherboard. The electronic board 280 may comprise a plurality of dielectric material layers (not shown) and may further include conductive routes 288 or "metallization" (shown in dashed lines) extending through the electronic board 280. As will be understood to those skilled in the art, the conductive routes 288 may be a combination of conductive traces (not shown) and conductive vias (not shown) extending through the plurality of dielectric material layers (not shown). These conductive traces and conductive vias are well known in the art and are not shown in FIG. 11 for purposes of clarity. As further shown in FIG. 11, an electrically-insulating underfill material 254 may be disposed between the electronic substrate 110 and the electronic board 280, which substantially encapsulates the substrate-to-substrate interconnects 250.

Further embodiments of the present may relate to a 'welding" process for the improvement of cables, cable-to-connectors connections, and connectors component connection using a high throughput additive manufacturing processes. The term "weld" and "welding" for the purposes of the present description are defined to mean the fusing of at least two components and/or the fusing of two edges of a single component with material formed by an additive process, such as a coldspray process, which forms an additive weld.

Figure 12:
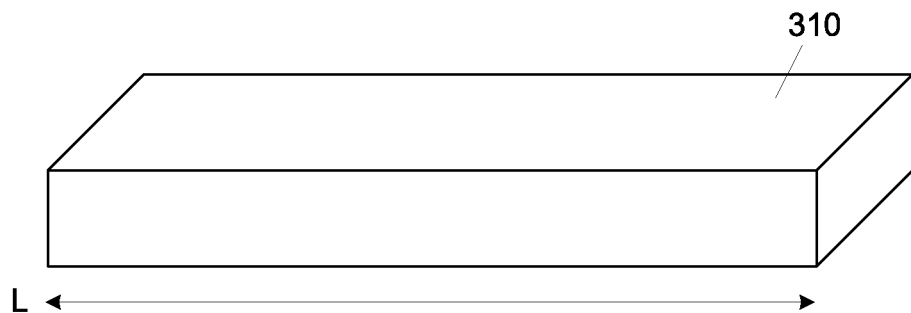
FIGS. 12-15 are isometric views of a process of fabricating a cable, according to an embodiment of the present description.

FIGS. 12-15 illustrate the use of an additive process to form a cable 300. As shown in FIG. 12, a cable core 310 may be formed having a length L along a direction of signal transmission. The cable core 310 may generical represent any internal structure for the cable 300 (see FIG. 15), such as a waveguide for a mmWave waveguide, or conductive wire(s) and an insulator material for a co-axial or twin-axial cable, as will be understood to those skilled in the art. In one embodiment, the cable core 310 may comprise a polymer, including, but not limited to, fluoropolymers (such as polyfluoroalkyl, polytetrafluoroethylene, fluorinated ethylene propylene, and the like), polyethylenes, cyclic olefin polymers or co-polymers, and the like.

Figure 13:
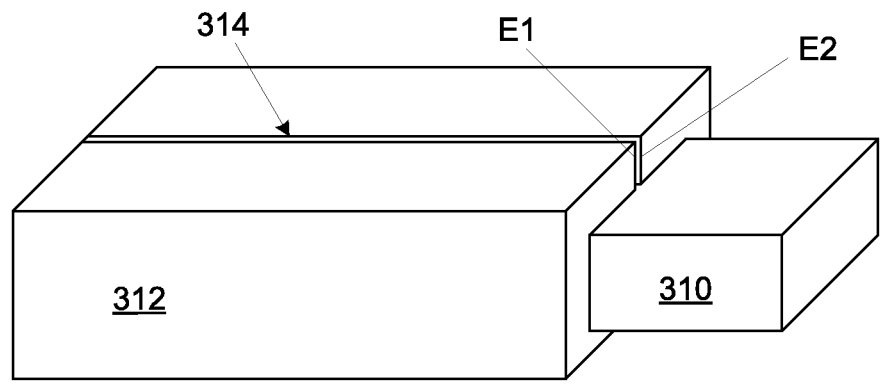

As shown in FIG. 13, a shielding layer 312 may be applied to substantially surround the cable core 310. In one embodiment of the present description, the shielding layer 312 may be a conductive foil wrap, wherein the application of the shielding layer 312 may result in a seam line 314 extending along the length L (see FIG. 12) of the cable core 310. The seam line 314 may be the result of two opposing edges E1 and E2 of the shielding layer 312 being adjacent one another when the shielding layer 312 is applied to the cable core 310. The shielding layer 312 may be made of any appropriate conductive material, including, but not limited to, metals. In one embodiment, the shielding layer 312 may be a conductive foil comprising copper, silver, nickel, gold, and aluminum, alloys thereof, and the like. In another embodiment, the shielding layer 312 may be a conductive foil comprising copper, silver, nickel, gold, and aluminum, alloys thereof, and the like, with a polymer film backing, such as a polyimide or the like.

Figure 14:
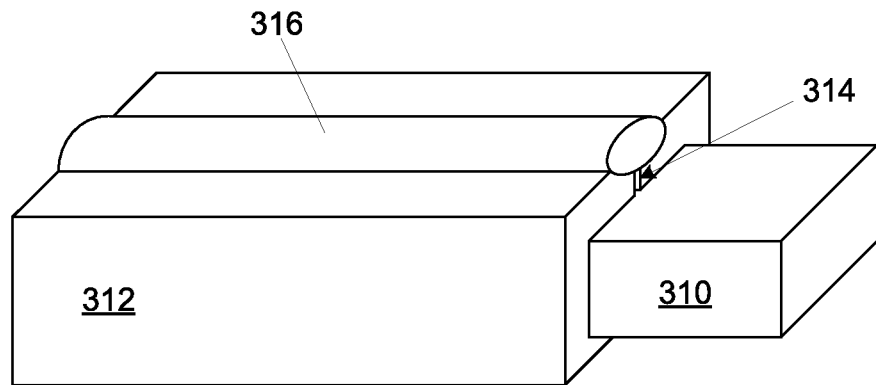

As shown in FIG. 14, the two opposing ends E1 and E2 of the shielding layer 312 may be fused together with an additive weld 316. In an embodiment, the additive weld 316 may be formed with a coldspray process. In one embodiment, the additive weld 316 may comprise a metal, such as copper, silver, nickel, gold, and aluminum, alloys thereof, and the like. It is, of course, understood that the conductive foil 312 may overlap such that the seam line 314 is formed at the point that one of the opposing edges E1 and E2 overlaps the shielding layer 312.

Figure 15:
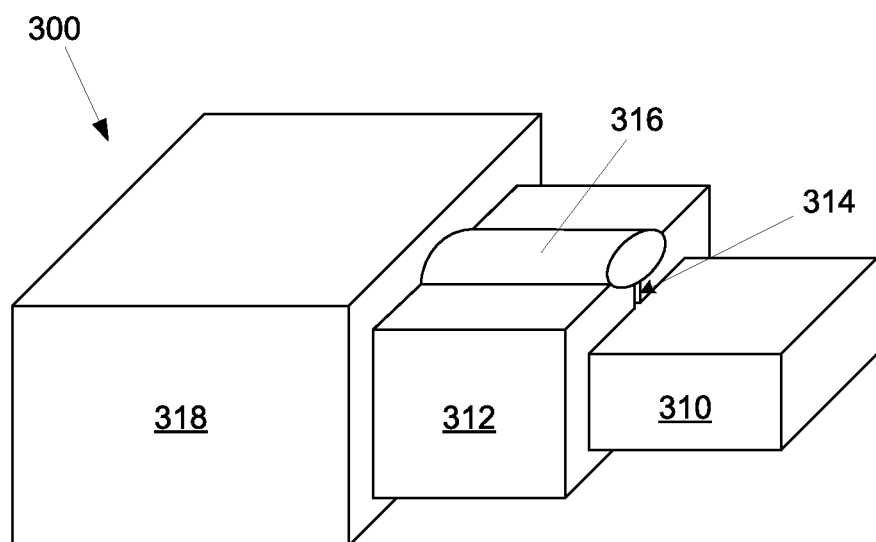

As shown in FIG. 15, a coating layer 318 may be formed over the shielding layer 312. In one embodiment, the coating layer 318 may be a heat-shrink tubing, such as a polyolefin or a polyethylene terephthalate film. In previous cables without an additive weld 316, a polyethylene terephthalate helical wrap was used to keep the shielding layer 312 in place, which imprinted wrinkles into the shielding layer 312 and, in turn, creates a transmission bandgap. The present embodiment eliminates this issue.

In another embodiment of the present description, the additive weld 316, as described in FIG. 14, may be utilized on various interfaces between components of an interconnect system to be assembled together. As will be understood to those skilled in the art, components of an interconnect system need to be conductive. Of course, due to the skin effect, these components need to only be conductive for a few micrometers (1-10 um) beyond a surface thereof. Thus, as previously discussed, the components may comprise non-conductive parts, such as plastics, that can be coated with a conductive material, such as by an additive process. Currently, these components are assembled together and ground continuity is achieved by mechanical contact. By using the additive weld 316, as described in FIG. 14, the ground continuity may be achieved by electrical contact, thereby achieving better performance, as will be understood to those skilled in the art. In specific, the use of the additive weld 316 may provide additional mechanical rigidity and stress relief points at a seam between components. Additionally, the use of the additive weld 316 may lead to higher performance due to a lower resistivity and a lower insertion loss (particularly with regard to a cable-connector assembly). Furthermore, the continuous shielding achieved by the use of the additive weld 316 may lead to increased electromagnetic interference shielding, lower cable insertion loss, less leakage, and higher grounding effectiveness.

Figure 16:
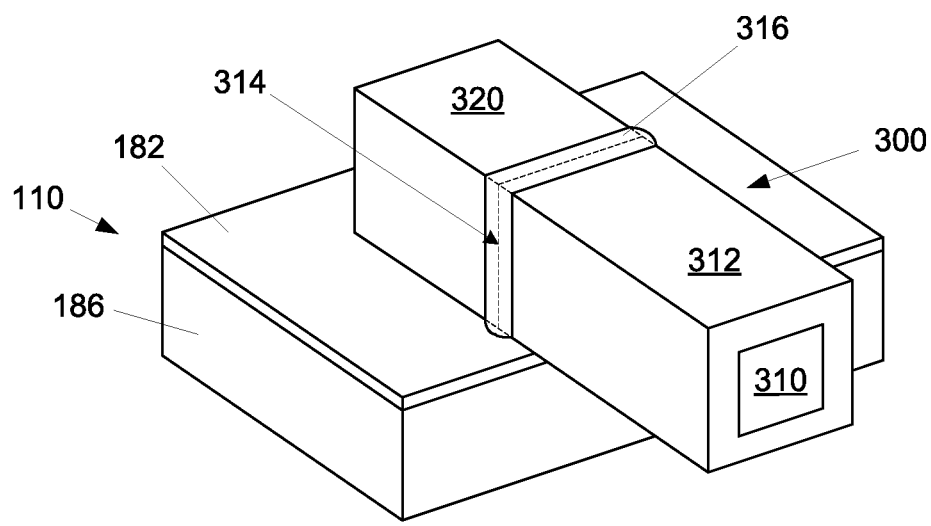
FIG. 16 is an isometric view of a cable fused to a side cable connector, according to an embodiment of the present description.

As shown in FIG. 16, the shielding layer 312 of the cable 300 (see FIG. 15) may be fused with the additive weld 316 to a cable connector 320, such as described with regard to the embodiments of FIGS. 1-11, incorporated herein by reference. As illustrated in FIG. 16, a seam line 314 (dashed line) is formed where the shielding layer 312 abuts the cable connector 320 and the additive weld 316 spans the seam line 314.

Figure 17:
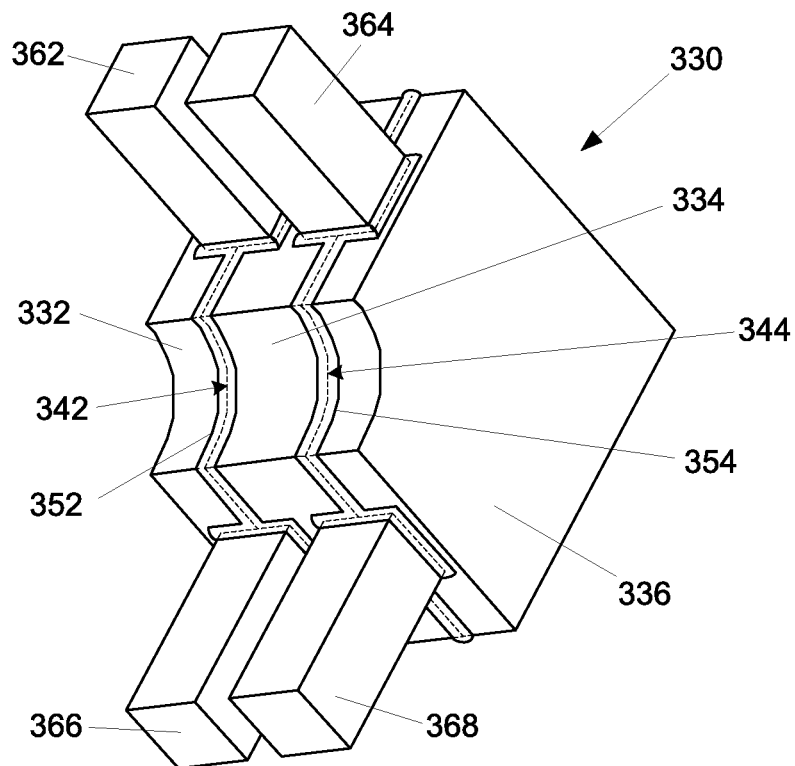
FIG. 17 is an isometric view of a cable connector, according to an embodiment of the present description.

As shown in FIG. 17, a connector 330, shown as a 90-degree waveguide connector, may comprise a plurality of stacked components (i.e. first component 332, second component 334, and third component 336). As illustrated, the interfaces between adjacent components form a first seam line 342 (dashed line) between the first component 322 and the second component 334, and a second seam line 344 (dashed line) between the second component 334 and the third component 336, wherein the first component 322 and the second component 334 are fused with a first additive weld 352, and the second component 334 and the third component 336 are fused with a second additive weld 354. It is noted that the first additive weld 352 may also fuse a first cable 362 and a second cable 364 to the first component 332 and the second component 334, and that the second additive weld 354 may also fuse a third cable 366 and a fourth cable 368 to the second component 334 and the third component 336.

It is understood that the embodiments illustrated in FIGS. 12-17 can be incorporated into the integrated circuit assembly 100 of FIG. 11.

As previously discussed, components, such as integrated circuit packages, require a very large number of system connections. These connections are needed for power delivery since thermal design power of integrated circuit packages can reach 100s-1000s of watts, which requires a very large number of power pins. Additionally, a large number of high-speed input/output (HSIO) connections, such as 16+ channel double data rate (DDR) and 128+ peripheral component interconnect express (PCIE) lanes, are needed to support the demand for higher bandwidth to system memory and other accelerators. This leads to very complex and high cost large sockets to support the huge number of pins between the integrated circuit package and the electronic substrate to which it is connected. Furthermore, the power and high-speed input/output signals need to travel through a relatively resistive and high parasitic path through a relatively large number of material layers from one side of the integrated circuit package to the other. This may result in poor power efficiency and reduced high speed channel link budget. Thus, at least one cable, in addition to the socket, may be utilized to provide at least a portion of the power and high-speed input/output signals.

Figure 18:
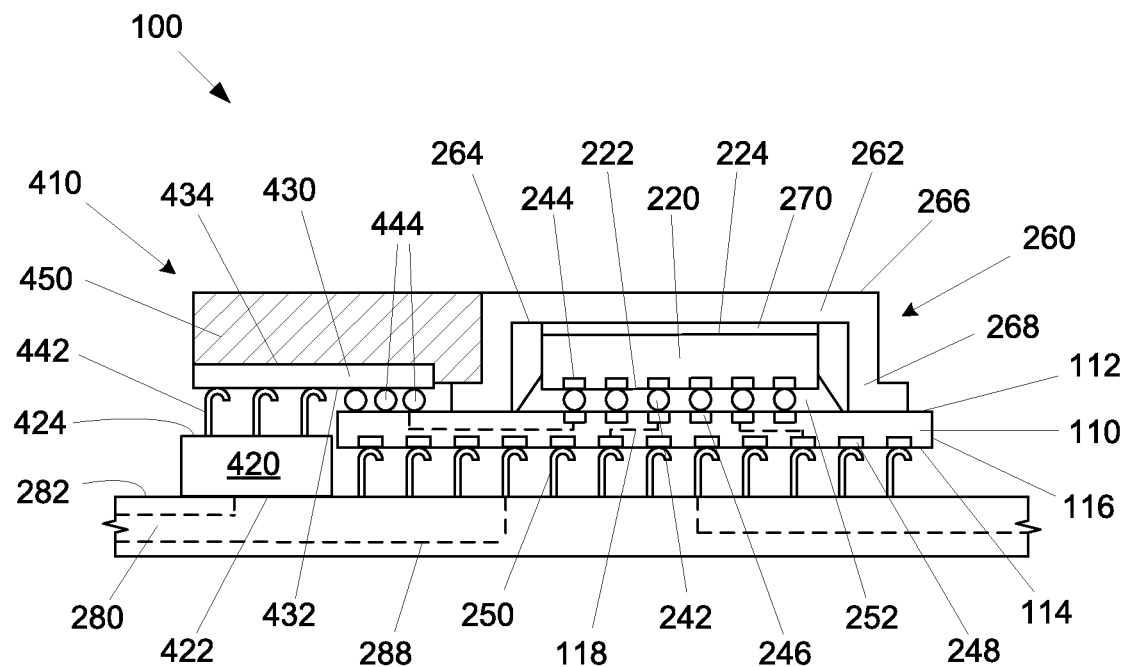
FIG. 18 is a side cross-sectional view of an integrated assembly having an additive support structure, according to an embodiment of the present description.

In one embodiment of the present description, at least one side mount module may be formed on the side of an integrated circuit package in order to support side connectivity to the package. In an embodiment illustrated in FIG. 18, the integrated circuit assembly 100 of FIG. 11 may have a side mount module 410 rather than the cable connector 210 and the cable 212. The side mount module 410 may comprises a side mount connector 420 (illustrated as a sub-socket) and a side mount bridge 430. A first surface 422 of a side mount connector 420 may be electrically attached to the first surface 282 of the electronic board 280. A second surface 424, which opposes the first surface 422 may be electrically attached to a first surface 432 of the side mount bridge 430 through at least one connector-to-bridge interconnect 442. In an embodiment, the connector-to-bridge interconnects 442 may be resilient socket pins, as illustrated. The first surface 432 of the side mount bridge 430 may also be electrically attached to the first surface 112 of the electronic substrate 110 with bridge-to-substrate interconnects 444, such as solder balls. The side mount bridge 430 may be any appropriate device, such as a voltage regulator, a high-speed input/output device, a mmWave module, a passive printed circuit board signal router, and the like.

The electrical attachment of the side mount bridge 430 to the electronic substrate 110 may result in a weak structure and can create a large moment at the bridge-to-substrate interconnects 444, especially if relatively high contact force is needed when the connector-to-bridge interconnects 442 are resilient socket pins. Although the side mount bridge 430 could potentially strengthen the structure using polymers or other glue-type materials, these materials are still relatively weak, have limitations on lifetime reliability especially with thermal cycling and constant mechanical loading, and may also impact the thermal performance of the heat dissipation device 260. In one embodiment of the present description, a material may be deposited using a high throughput additive manufacturing process, such as cold spraying as previously discussed, to fuse the side mount bridge 430 to the heat dissipation device 260 forming an additive support structure 450. This embodiment may provide a strong mechanical connection between the side mount bridge 430 and the heat dissipation device 260, and may improve the thermal spreading performance of the heat dissipation device 260. In one embodiment of the present invention, the additive support structure 450 may be made of a high thermal conductive material, including, but not limited to, metals (such as copper, silver, aluminum, alloys thereof, and the like), non-metals (such as diamond, silicon carbide, boron nitride, aluminum nitride), and any combinations of metal and non-metal materials. As shown, the additive support structure 450 may extend over a second surface 434 of the side mount bridge 430.

In one embodiment, the substrate-to-substrate interconnects 250 may be used for standard signal connection, while the side mount module 410 may be used for specialty connections or be customized based on the system connectivity and power requirements. For example, the side mount module 410 may support ultra-low resistance contacts, or ultra-high frequency connections, such as mmWave or optical connections.

Figure 19:
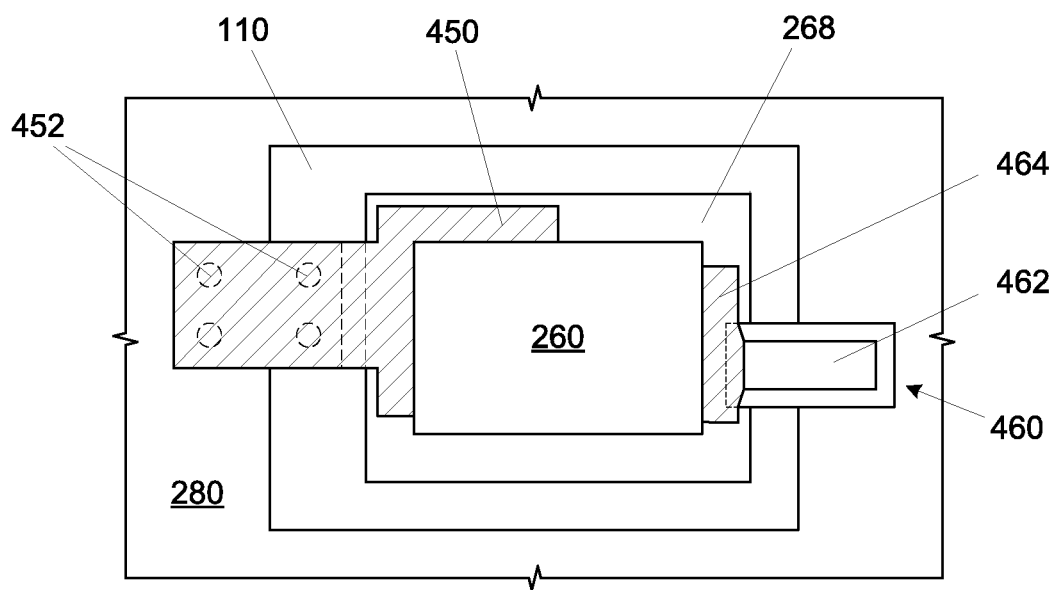
FIG. 19 is a plan view of an integrated assembly having multiple additive support structures, according to another embodiment of the present description.

The additive support structure 450 may have any appropriate configuration, as shown in FIG. 19, the additive support structure 450 may connect from at least a portion of the at least one boundary wall and foot 268 to reinforced points 452 within the side mount module 410, such as screws that connect to a backplate (not shown) or thick plated through hole vias (not shown). Additionally, more than one side mount module may be attached to the electronic substrate 110. As illustrated in FIG. 19, a second side mount module 460 having a second heat dissipation device 462 may be electrically attached to the electronic substrate 110, wherein an additive support structure 464 may connect the heat dissipation device 260 to the second heat dissipation device 462. Although the embodiments are shown with the additive support structure 450 proximate the first surface 112 of the electronic interposer 110, it is understood that an additional additive support structure (not shown) may be formed proximate the second surface 114 of the electronic interposer 110.

Figure 20:
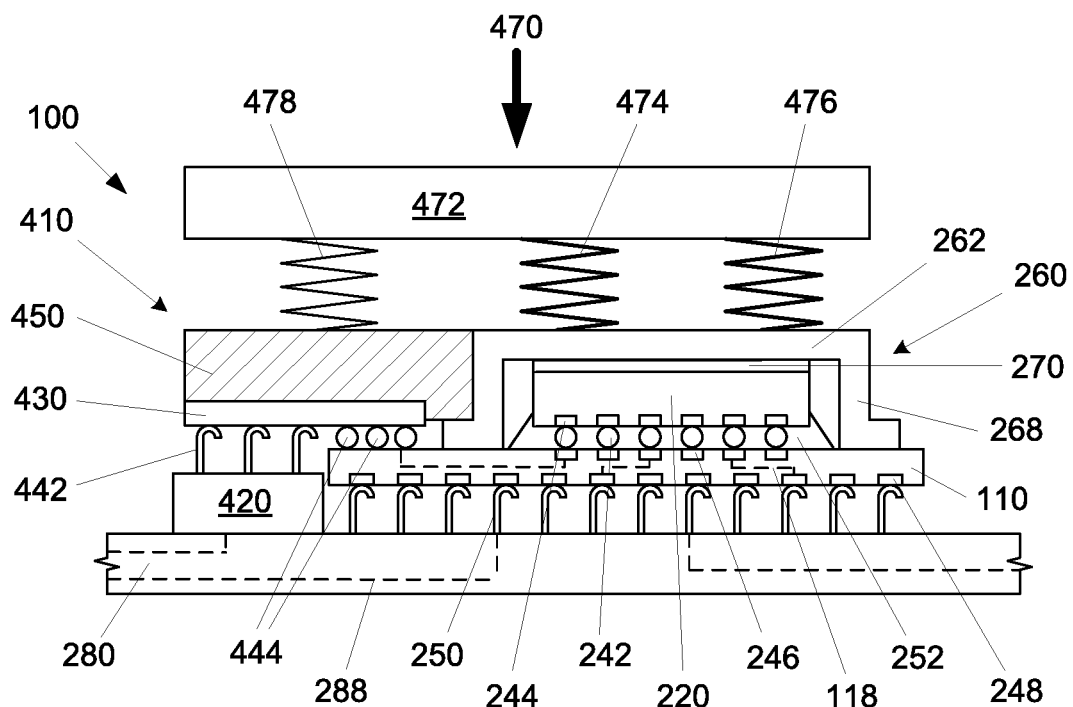
FIGS. 20-23 are side cross-sectional views of integrated assembles having additive support structures, according to various embodiments of the present description.

As shown in FIG. 20, a load (arrow 470) is generally applied to the integrated circuit assembly 100 when a socket is used to electrically attached the electronic interposer 110 to the electronic board 280. As illustrated, a load mechanism 472 having a plurality of springs 474, 476, and 478 may be used. The springs 474, 476, 478 may be of differing types or materials to tune the applied force for the heat dissipation device 260 (springs 474 and 476) and the side mount module 410 (spring 478) depending on the requirements for each.

Figure 21:
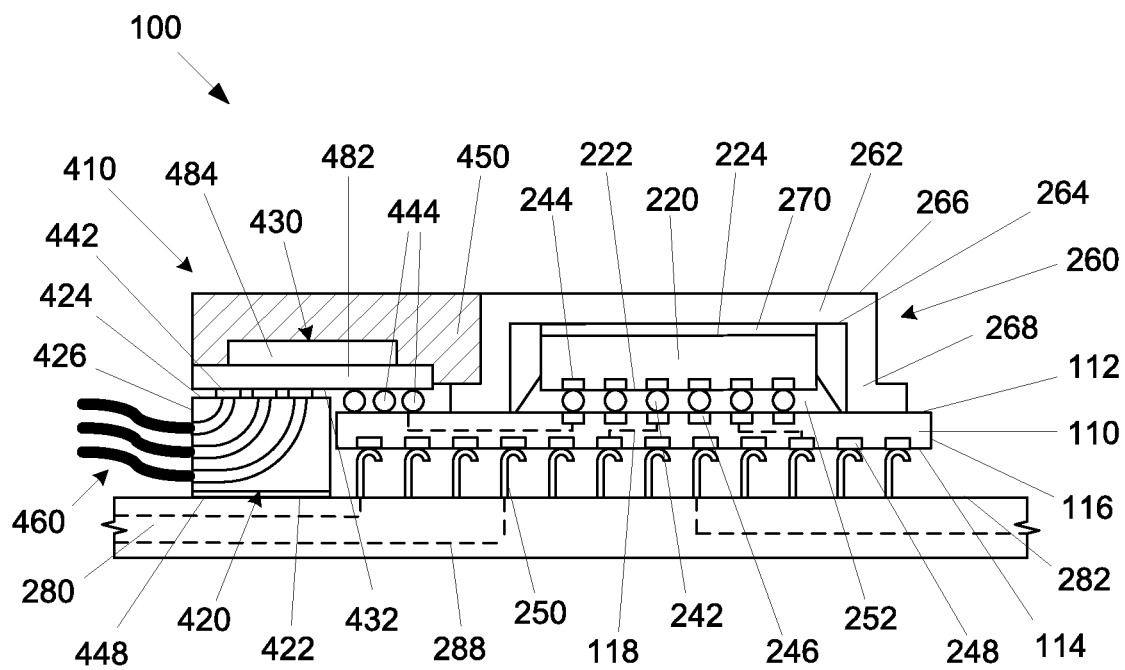

As shown in FIG. 21, the side mount module 410 may be used to provide high frequency connections. In this embodiment, the side mount module 410 need not be electrically connected to the electronic board 280, rather, as shown, the side mount connector 420 (illustrated as a waveguide connector) may be attached by the first surface 422 thereof to the first surface 282 of the electronic board 280 by an adhesive material layer 448. In one embodiment, the adhesive material layer 448 may comprise a compressible/resilient material. A data cable 460 (illustrated as waveguide bundle) may be attached to the side mount connector 420 (i.e. waveguide connector) at one side 426 thereof, wherein the side mount connector 420 routes signals to the second surface 424 thereof. The side mount bridge 420 (see FIG. 18) may comprise a waveguide substrate 482 and at least one waveguide processor 484 attached to a waveguide substrate 482. The waveguide substrate 482 may be attached to the side mount connector 420 and the first surface 112 of the electronic substrate 110.

Figure 22:
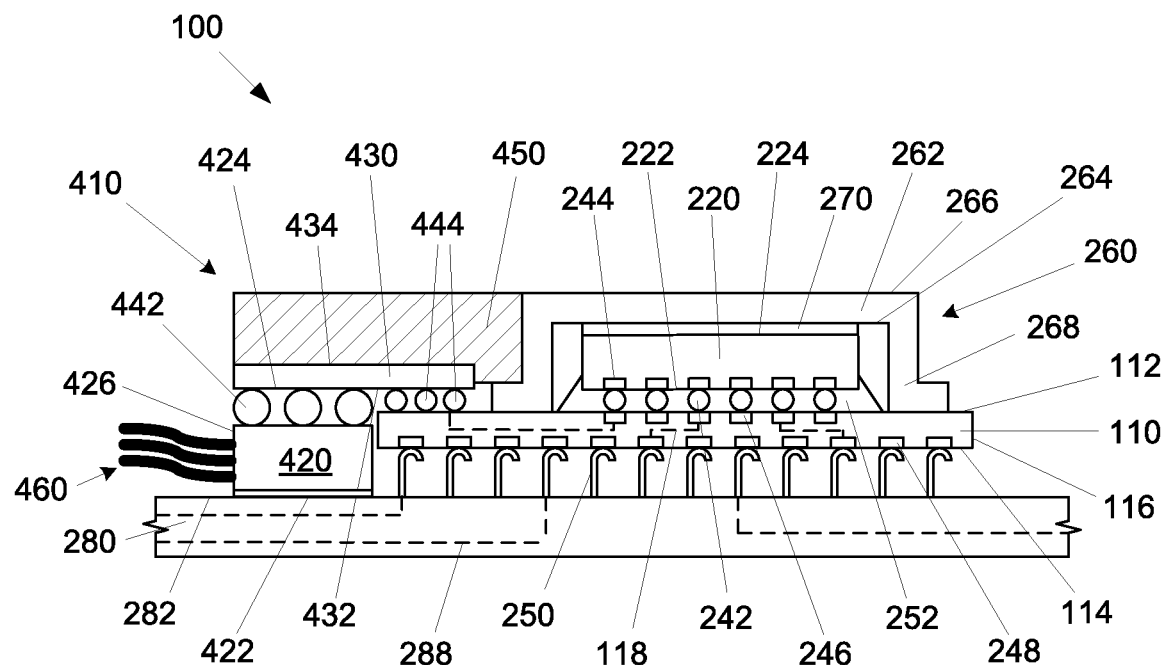

As shown in FIG. 22, the side mount module 410 may be used as a passive, high-speed signal routing structure to support high frequency channels, such as additional peripheral component interconnect express (PCIE) lanes or double data rate (DDR) channels depending on specific server requirements. In this embodiment, the side mount connector 420 may be a high-speed connector and the side mount bridge 430 may be a passive fan-out board or package. The side mount connector 420 may be attached by the first surface 422 thereof to the first surface 282 of the electronic board 280 by the adhesive material layer 448. A data cable 480 may be attached to the side mount connector 420 at one side 426 thereof, wherein the side mount connector 420 routes signals to the second surface 424 thereof. The side mount bridge 430 (i.e. passive fan-out board or package) may be attached to the second surface 424 of the side mount connector 420 and the first surface 112 of the electronic substrate 110. As will be understood to those skilled in the art, the side mount bridge 430 (i.e. passive fan-out board or package) may translate the relatively wide pitch of the connector-to-bridge interconnects 442 to a relatively narrow pitch of the bridge-to-substrate interconnects 444.

Figure 23:
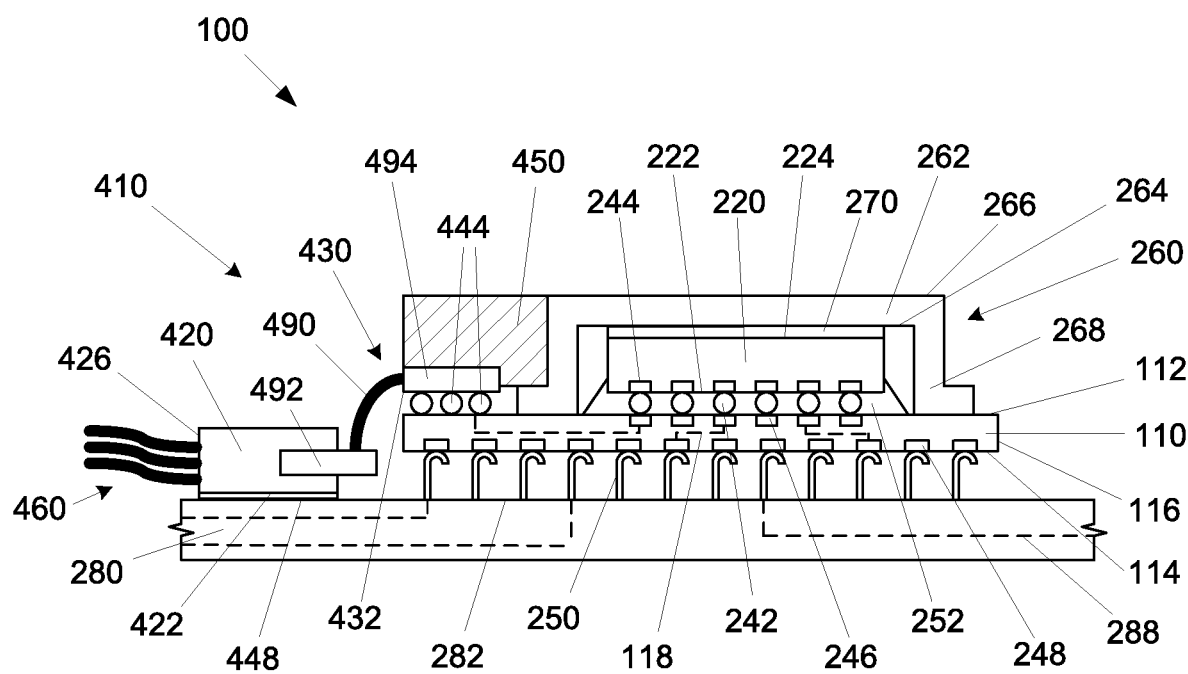

As shown in FIG. 23, the side mount module 410 may be used support a flex cable with an active multiplexing module or a passive passthrough component. This embodiment may be needed in extremely large integrated circuit packages where the force 470 (see FIG. 20) needed for attachment (e.g. for a main socket) exceeds the strength of the electronic board 280 or a backplate (not shown) supporting the electronic board 280, or where require expensive components are required to overcome this issue. This embodiment may allow for splitting off some input/output signals from the loading force 270 (see FIG. 20) needed. In this embodiment, the side mount connector 420, such as an active multiplexing module or a passive passthrough component, may be attached by the first surface 422 thereof to the first surface 282 of the electronic board 280 by the adhesive material layer 448. The data cable 460 may be attached to the side mount connector 420 at one side 426 thereof, wherein the side mount connector 420 routes signals to the side mount bridge 430, which, in this embodiment, may be a passive rigid flex board 490 having a first portion 492 inserted into the side mount connector 420 and an opposing second portion 494 attached by bridge-to-substrate interconnects 446 to the first surface 112 of the electrical substrate 110.

Figure 24:
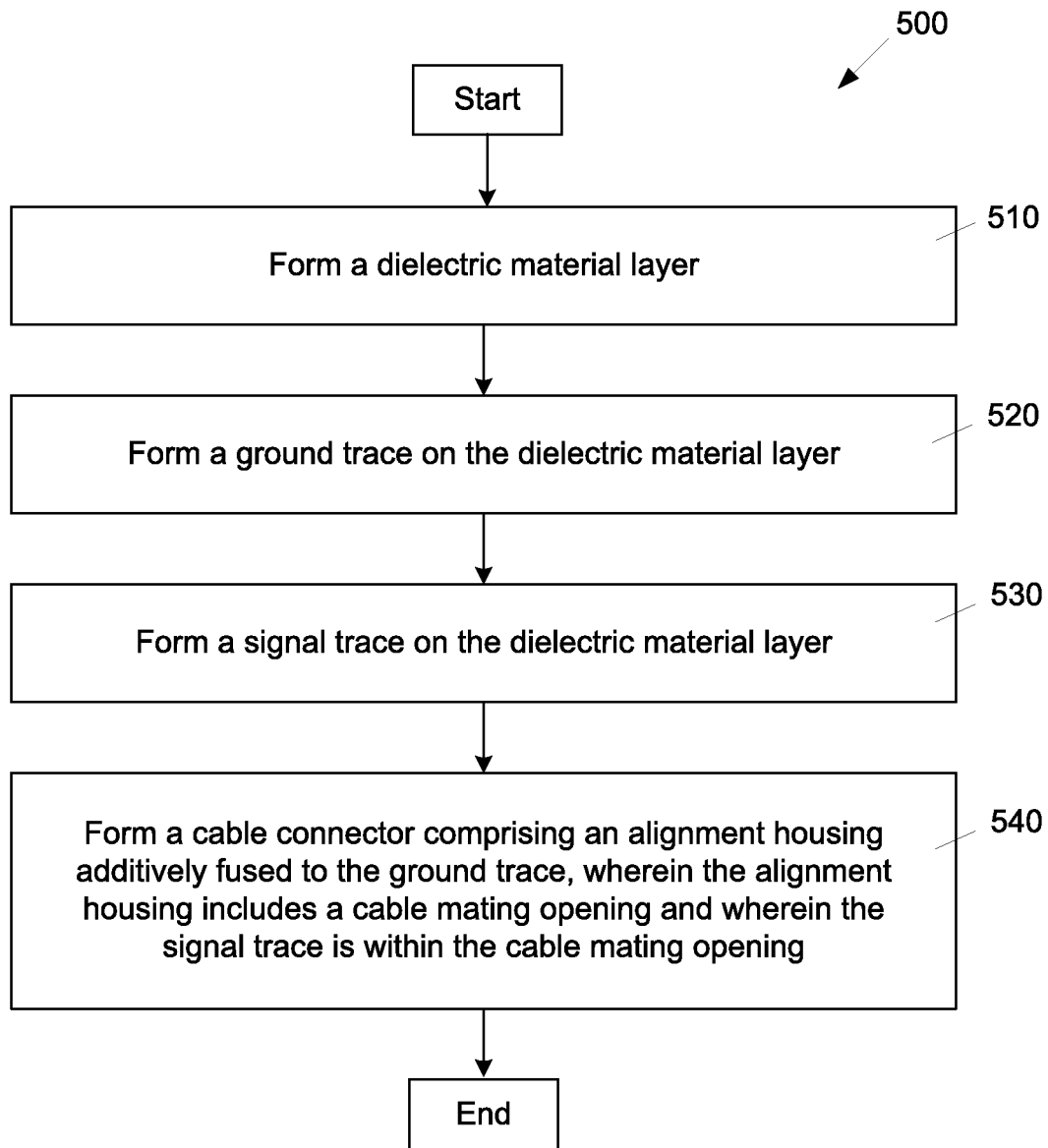
FIG. 24 is a flow chart of a process of fabricating a cable connector on a substrate, according to an embodiment of the present description.

FIG. 24 is a flow chart of a process 500 of fabricating a cable connector on an electronic substrate according to an embodiment of the present description. As set forth in block 510, a dielectric material layer may be formed. A ground trace may be formed on the dielectric material layer, as set forth in block 520. As set forth in block 530, a signal trace may be formed on the dielectric material layer. A cable connector may be formed comprising an alignment housing additively fused to the ground trace, wherein the alignment housing includes a cable mating opening and wherein the signal trace is within the cable mating opening, as set forth in block 540.

Figure 25:
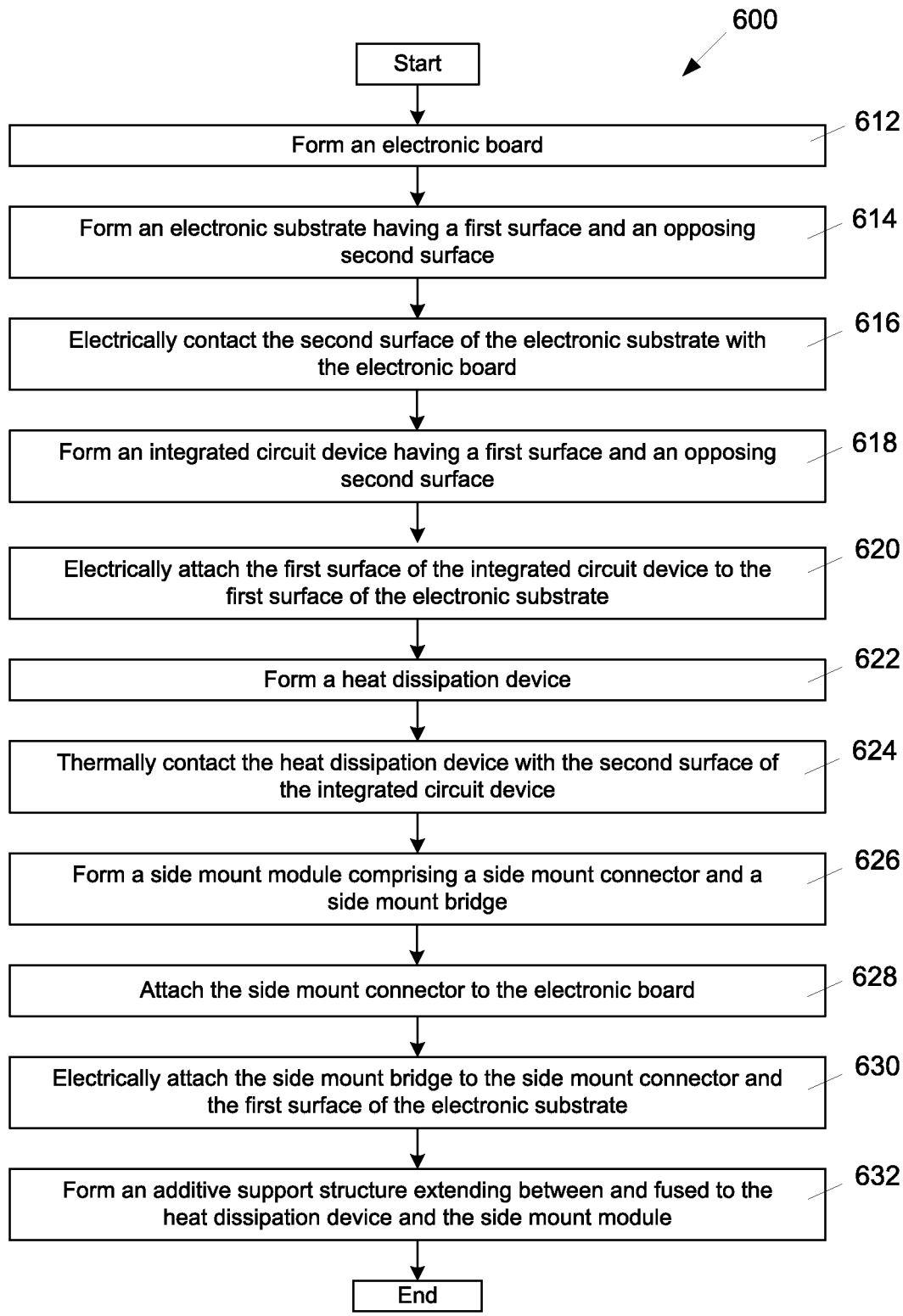
FIG. 25 is a flow chart of a process of fabricating an integrated circuit assembly, according to another embodiment of the present description.

FIG. 25 is a flow chart of a process 600 of fabricating an integrated circuit assembly according to an embodiment of the present description. As set forth in block 612, an electronic board may be formed. An electronic substrate having a first surface and an opposing second surface may be formed, as set forth in block 614. As set forth in block 616, the second surface of the electronic substrate may be electrically contacted with electronic board. An integrated circuit device may be formed having a first surface and an opposing second surface, as set forth in block 618. As set forth in block 620, the first surface of the integrated circuit device may be electrically attached to the first surface of the electronic substrate. A heat dissipation device may be may be formed, as set forth in block 622. As set forth in block 624, the heat dissipation device may be thermally contacted with the second surface of the integrated circuit device. A side mount module comprising a side mount connector and a side mount bridge may be form, as set forth in block 626. As set forth in block 628, the side mount connector may be attached to the electronic board. The side mount bridge may be electrically attached to the side mount connector and the first surface of the electronic substrate, as set forth in block 630. As set forth in block 632, an additive support structure may be formed to extend between and be fused to the heat dissipation device and the side mount module.

Figure 26:
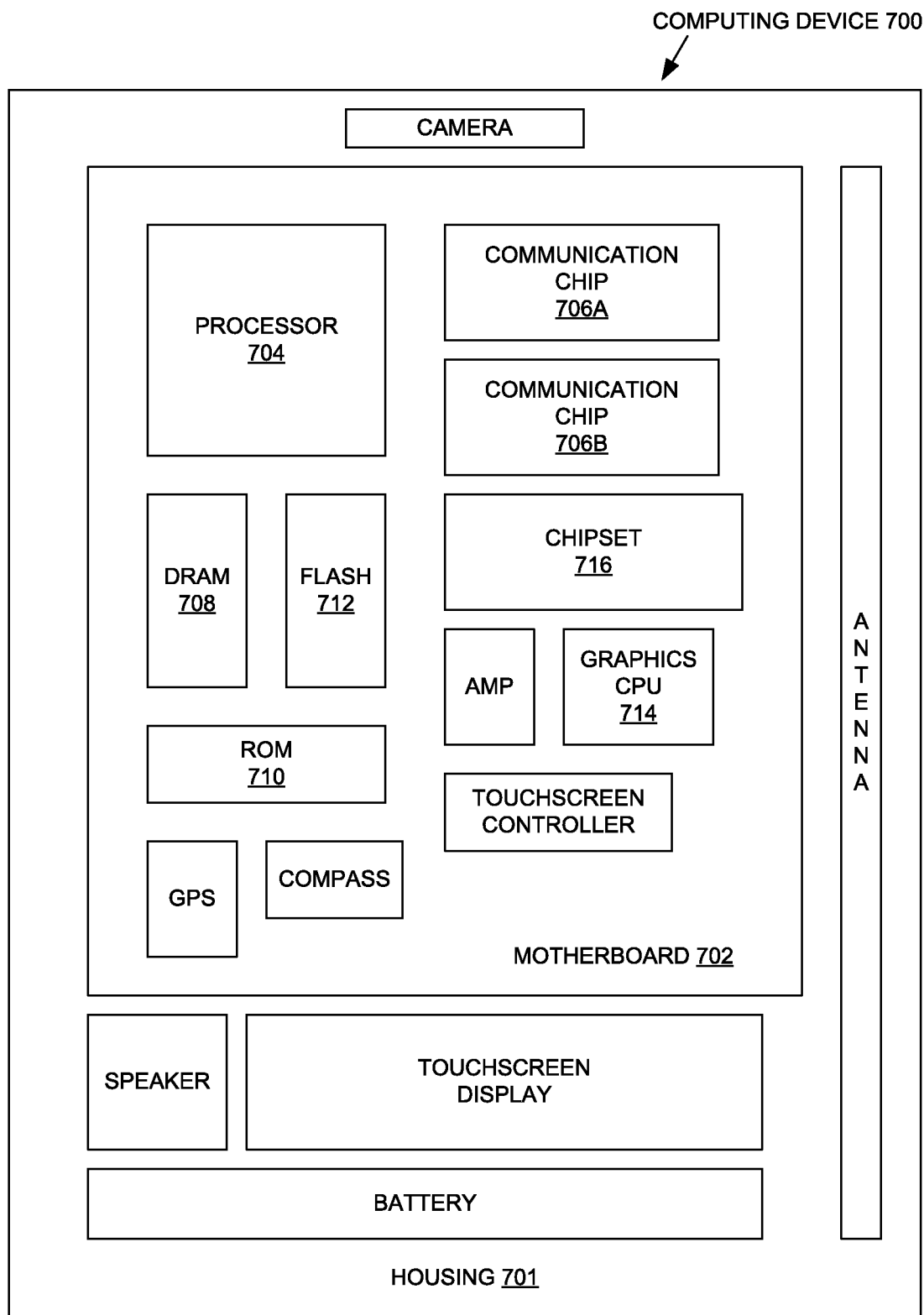
FIG. 26 is an electronic system, according to one embodiment of the present description.

FIG. 26 illustrates an electronic or computing device 700 in accordance with one implementation of the present description. The computing device 700 may include a housing 701 having a board 702 disposed therein. The computing device 700 may include a number of integrated circuit components, including but not limited to a processor 704, at least one communication chip 706A, 706B, volatile memory 708 (e.g., DRAM), non-volatile memory 710 (e.g., ROM), flash memory 712, a graphics processor or CPU 714, a digital signal processor (not shown), a crypto processor (not shown), a chipset 716, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 702. In some implementations, at least one of the integrated circuit components may be a part of the processor 704.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include any of the embodiments of the present description.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-26. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an integrated circuit assembly comprising a dielectric material layer, a ground trace on the dielectric material layer, a signal trace on the dielectric material layer; and a cable connector comprising an alignment housing additively fused to the ground trace, wherein the alignment housing includes a cable mating opening and wherein the signal trace is within the cable mating opening.

In Example 2, the subject matter of Example 1 can optionally include a connective pin additively fused to the signal trace.

In Example 3, the subject matter of any of Examples 1 to 2 can optionally include the cable connector comprising a single conductive material.

In Example 4, the subject matter of any of Examples 1 to 2 can optionally include the cable connector comprising non-conductive core and a conductive material coating.

In Example 5, the subject matter of Example 4 can optionally include the conductive material coating being additively fused to the ground trace.

In Example 6, the subject matter of any of Examples 1 to 5 can optionally include the alignment housing including a keying feature.

Example 7 is an integrated circuit assembly comprising an electronic substrate having a first surface and an opposing second surface, wherein the electronic substrate includes at least one dielectric material layer, at least one ground trace on the dielectric material layer, and at least one signal trace on the dielectric material layer; a cable connector comprising an alignment housing additively fused to the ground trace, wherein the alignment housing includes a cable mating opening and wherein the signal trace is within the cable mating opening; a cable within the cable mating opening of the cable connector and electrically connected to the electronic substrate; and an integrated circuit device electrically attached to a first surface of the electronic substrate, wherein the cable is electrically connected to the integrated circuit device through the electronic substrate.

In Example 8, the subject matter of Example 7 can optionally include a connective pin additively fused to the signal trace.

In Example 9, the subject matter of any of Examples 7 to 8 can optionally include the cable connector comprising a single conductive material.

In Example 10, the subject matter of any of Examples 7 to 8 can optionally include the cable connector comprising non-conductive core and a conductive material coating.

In Example 11, the subject matter of Example 10 can optionally include the conductive material coating being additively fused to the ground trace.

In Example 12, the subject matter of any of Examples 7 to 11 can optionally include an electronic board, wherein the second surface of the electronic substrate is electrically attached to the electronic board.

In Example 13, the subject matter of any of Examples 7 to 12 can optionally include the alignment housing including a keying feature.

Example 14 is method of fabricating an integrated circuit assembly comprising forming a dielectric material layer, forming a ground trace on the dielectric material layer, forming a signal trace on the dielectric material layer, and forming a cable connector comprising an alignment housing additively fused to the ground trace, wherein the alignment housing includes a cable mating opening and wherein the signal trace is within the cable mating opening.

In Example 15, the subject matter of Example 14 can optionally include forming a connective pin additively fused to the signal trace.

In Example 16, the subject matter of Example 15 can optionally include forming a cable including at least one wire and a shielding layer; electrically attaching at least one wire of the cable to the connective pin, and forming the alignment housing over the at least one wire and connective pin, wherein the alignment housing electrically contacts the shielding layer of the cable.

In Example 17, the subject matter of any of Examples 14 to 16 can optionally include forming the cable connector from a single conductive material.

In Example 18, the subject matter of any of Examples 14 to 16 can optionally include forming the cable connector comprising forming a non-conductive core and forming a conductive material coating on the non-conductive core.

In Example 19, the subject matter of any of Examples 14 to 18 can optionally include additively fusing the conductive material coating to the ground trace.

In Example 20, the subject matter of any of Examples 14 to 19 can optionally include the alignment housing including a keying feature.

Example 21 is a cable comprising a cable core, a shielding layer substantially surrounding the cable core, a seam line defined by the shielding layer extending along a length of cable core, and an additive weld spanning the seam line.

In Example 22, the subject matter of Example 21 can optionally include the seam line being defined by a first edge of the shielding layer adjacent a second edge of the shielding layer.

In Example 23, the subject matter of any of Examples 21 to 22 can optionally include the shielding layer comprising a metal.

In Example 24, the subject matter of any of Examples 21 to 23 can optionally include the shielding layer comprising a conductive foil.

In Example 25, the subject matter of any of Examples 21 to 24 can optionally include the shielding layer comprising a conductive foil with a polymer film backing.

In Example 26, the subject matter of any of Examples 21 to 25 can optionally include the additive weld comprising a metal.

In Example 27, the subject matter of any of Examples 21 to 26 can optionally include a coating layer over the shielding layer and the additive weld.

In Example 28, the subject matter of any of Examples 21 to 27 can optionally include the coating layer comprises a heat-shrink tube.

In Example 29, the subject matter of Example 28 can optionally include the heat-shrink tube comprises polyolefin.

In Example 30, the subject matter of any of Examples 21 to 29 can optionally include the cable core comprising a waveguide.

In Example 31, the subject matter of any of Examples 21 to 29 can optionally include the cable core comprising at least one conductive wire and an insulator material.

Example 32 is an integrated circuit assembly comprising an electronic substrate, a cable connector electrically attached to the electronic substrate, a cable attached to the cable connector, wherein the cable comprises a cable core and a shielding layer substantially surrounding the cable core, and wherein the shielding layer is adjacent the cable connector with a seam line defined between the shielding layer and the cable connector, and an additive weld spanning the seam line.

In Example 33, the subject matter of Example 32 can optionally include the shielding layer comprising a conductive foil.

In Example 34, the subject matter of Example 32 can optionally include the shielding layer comprising a conductive foil with a polymer film backing.

In Example 35, the subject matter of any of Examples 32 to 34 can optionally include the additive weld comprising a metal.

In Example 36, the subject matter of any of Examples 32 to 35 can optionally include the cable core comprising a waveguide.

In Example 37, the subject matter of any of Examples 32 to 35 can optionally include the cable core comprising at least one conductive wire and an insulator material.

Example 38 is an integrated circuit assembly comprising an electronic substrate, a cable connector electrically attached to the electronic substrate, a cable attached to the cable connector, wherein the cable comprises a cable core and a shielding layer substantially surrounding the cable core, and wherein the shielding layer is adjacent the cable connector with a seam line defined between the shielding layer and the cable connector, and an additive weld spanning the seam line.

In Example 39, the subject matter of Example 38 can optionally include at least one cable attached to the cable connector, wherein the additive weld extends between the first component and the at least one cable and between the second component and the at least one cable.

In Example 40, the subject matter of any of Examples 38 to 39 can optionally include the additive weld comprising a metal.

Example 41 is an integrated circuit assembly comprising an electronic board; an electronic substrate having a first surface and an opposing second surface, wherein second surface of the electronic substrate is in electrical contact with the electronic board; an integrated circuit device having a first surface and an opposing second surface, wherein the first surface of the integrated circuit device is electrically attached to the first surface of the electronic substrate; a heat dissipation device in thermal contact with the second surface of the integrated circuit device; a side mount module comprising a side mount connector electrically attached to the electronic board and a side mount bridge electrically attached to the side mount connector and the first surface of the electronic substrate; and an additive support structure extending between and fused to the heat dissipation device and the side mount module.

In Example 42, the subject matter of Example 41 can optionally include the additive support structure being thermally conductive.

In Example 43, the subject matter of Example 41 can optionally include the additive support structure being a material selected from the group consisting of copper, silver, aluminum, and alloys thereof.

In Example 44, the subject matter of Example 41 can optionally include the additive support structure being a material selected from the group consisting of diamond, silicon carbide, boron nitride, and aluminum nitride.

In Example 45, the subject matter of any of Examples 41 to 44 can optionally include the side mount bridge comprising a passive device.

In Example 46, the subject matter of any of Examples 41 to 44 can optionally include the side mount bridge comprising an active device.

Example 47 is an integrated circuit assembly comprising an electronic board; an electronic substrate having a first surface and an opposing second surface, wherein the second surface of the electronic substrate is in electrical contact with the electronic board; an integrated circuit device having a first surface and an opposing second surface, wherein the first surface of the integrated circuit device is electrically attached to the first surface of the electronic substrate; a heat dissipation device in thermal contact with the second surface of the integrated circuit device; a side mount module comprising a side mount connector attached to the electronic board and a side mount bridge attached to the side mount connector and the first surface of the electronic substrate; a data cable attached to the side mount connector; and an additive support structure extending between and fused to the heat dissipation device and the side mount module.

In Example 48, the subject matter of Example 47 can optionally include an adhesive layer between the side mount module and the electronic board.

In Example 49, the subject matter of any of Examples 47 to 48 can optionally include the additive support structure being thermally conductive.

In Example 50, the subject matter of any of Example 47 to 49 can optionally include the additive support structure being a material selected from the group consisting of copper, silver, aluminum, and alloys thereof.

In Example 51, the subject matter of any of Examples 47 to 49 can optionally include the additive support structure being a material selected from the group consisting of diamond, silicon carbide, boron nitride, and aluminum nitride.

In Example 52, the subject matter of any of Examples 47 to 51 can optionally include the side mount bridge comprising a passive device.

In Example 53, the subject matter of any of Examples 47 to 51 can optionally include the side mount bridge comprising an active device.

Example 54 is a method of fabricating an integrated circuit assembly comprising forming an electronic board; forming an electronic substrate having a first surface and an opposing second surface; electrically contacting the second surface of the electronic substrate with the electronic board; forming an integrated circuit device having a first surface and an opposing second surface; electrically attaching the first surface of the integrated circuit device to the first surface of the electronic substrate; forming a heat dissipation device; thermally contacting the heat dissipation device with the second surface of the integrated circuit device; forming a side mount module comprising a side mount connector and a side mount bridge; attaching the side mount connector to the electronic board; attaching the side mount bridge to the side mount connector and the first surface of the electronic substrate; a data cable attached to the side mount connector; and forming an additive support structure extending between and fused to the heat dissipation device and the side mount module.

In Example 55, the subject matter of Example 54 can optionally include forming the additive support structure comprises forming a thermally conductive additive support structure.

In Example 56, the subject matter of any of Examples 54 to 55 can optionally include the side mount bridge comprising a passive device.

In Example 57, the subject matter of any of Examples 54 to 55 can optionally include the side mount bridge comprising an active device.

In Example 58, the subject matter of any of Examples 54 to 57 can optionally include electrically attaching the side mount connector to the electronic board.

In Example 59, the subject matter of any of Examples 54 to 58 can optionally include attaching the side mount connector to the electronic board with an adhesive layer.

In Example 60, the subject matter of any of Examples 54 to 59 can optionally include attaching a data cable to the side mount connector.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:
1. An integrated circuit assembly, comprising:
an electronic board;

an electronic substrate having a first surface and an opposing second surface, wherein the second surface of the electronic substrate is in electrical contact with the electronic board;

an integrated circuit device having a first surface and an opposing second surface, wherein the first surface of the integrated circuit device is electrically attached to the first surface of the electronic substrate;

a heat dissipation device in thermal contact with the second surface of the integrated circuit device;

a side mount module comprising a side mount connector electrically attached to the electronic board and a side mount bridge electrically attached to the side mount connector and the first surface of the electronic substrate; and an additive support structure extending between and fused to the heat dissipation device and the side mount module.

2. The integrated circuit assembly of claim 1, wherein the additive support structure is thermally conductive.

3. The integrated circuit assembly of claim 2, wherein the additive support structure comprises a material selected from the group consisting of copper, silver, aluminum, and alloys thereof.

4. The integrated circuit assembly of claim 2, wherein the additive support structure comprises a material selected from the group consisting of diamond, silicon carbide, boron nitride, and aluminum nitride.

5. The integrated circuit assembly of claim 1, wherein the side mount bridge comprises a passive device.

6. The integrated circuit assembly of claim 1, wherein the side mount bridge comprises an active device.

7. An integrated circuit assembly, comprising:
an electronic board;
an electronic substrate having a first surface and an opposing second surface, wherein the second surface of the electronic substrate is in electrical contact with the electronic board;
an integrated circuit device having a first surface and an opposing second surface, wherein the first surface of the integrated circuit device is electrically attached to the first surface of the electronic substrate;
a heat dissipation device in thermal contact with the second surface of the integrated circuit device;
a side mount module comprising a side mount connector attached to the electronic board and a side mount bridge attached to the side mount connector and the first surface of the electronic substrate;
a data cable attached to the side mount connector; and
an additive support structure extending between the heat dissipation device and the side mount module.

8. The integrated circuit assembly of claim 7, further comprising an adhesive layer between the side mount module and the electronic board.

9. The integrated circuit assembly of claim 7, wherein the additive support structure is thermally conductive.

10. The integrated circuit assembly of claim 7, wherein the additive support structure comprises a material selected from the group consisting of copper, silver, aluminum, and alloys thereof.

11. The integrated circuit assembly of claim 7, wherein the additive support structure comprises a material selected from the group consisting of diamond, silicon carbide, boron nitride, and aluminum nitride.

12. The integrated circuit assembly of claim 7, wherein the side mount bridge comprises a passive device.

13. The integrated circuit assembly of claim 7, wherein the side mount bridge comprises an active device.

14. A method of fabricating an integrated circuit assembly, comprising:
forming an electronic board;
forming an electronic substrate having a first surface and an opposing second surface;
electrically contacting the second surface of the electronic substrate with the electronic board;
forming an integrated circuit device having a first surface and an opposing second surface;
electrically attaching the first surface of the integrated circuit device to the first surface of the electronic substrate;
forming a heat dissipation device;
thermally contacting the heat dissipation device with the second surface of the integrated circuit device;
forming a side mount module comprising a side mount connector and a side mount bridge;
attaching the side mount connector to the electronic board;
attaching the side mount bridge to the side mount connector and the first surface of the electronic substrate; and
forming an additive support structure extending between and fused to the heat dissipation device and the side mount module.

15. The method of claim 14, wherein forming the additive support structure comprises forming a thermally conductive additive support structure.

16. The method of claim 14, wherein the side mount bridge comprises a passive device.

17. The method of claim 14, wherein the side mount bridge comprises an active device.

18. The method of claim 14, wherein attaching the side mount connector to the electronic board comprises electrically attaching the side mount connector to the electronic board.

19. The method of claim 14, wherein attaching the side mount connector to the electronic board comprises attaching the side mount connector to the electronic board with an adhesive material layer.

20. The method of claim 19, further comprising attaching a data cable to the side mount connector.

* * * * *